(12) United States Patent
Kaneko et al.

(10) Patent No.: US 9,182,468 B2
(45) Date of Patent: Nov. 10, 2015

(54) RF RECEPTION COIL AND MAGNETIC RESONANCE IMAGING APPARATUS USING SAME

(75) Inventors: Yukio Kaneko, Kawaguchi (JP); Hideta Habara, Musashino (JP); Yoshihisa Soutome, Tokyo (JP); Yosuke Otake, Mitaka (JP); Hisaaki Ochi, Kodaira (JP); Yoshitaka Bito, Kokubunji (JP)

(73) Assignee: Hitachi Medical Corporation, Tokyo (JP)

( * ) Notice: Subject to any disclaimer, the term of this patent is extended or adjusted under 35 U.S.C. 154(b) by 739 days.

(21) Appl. No.: 13/577,241

(22) PCT Filed: Jan. 26, 2011

(86) PCT No.: PCT/JP2011/051504
§ 371 (c)(1),
(2), (4) Date: Aug. 4, 2012

(87) PCT Pub. No.: WO2011/122086
PCT Pub. Date: Oct. 6, 2011

(65) Prior Publication Data
US 2012/0306497 A1    Dec. 6, 2012

(30) Foreign Application Priority Data

Mar. 30, 2010   (JP) ................................. 2010-078954

(51) Int. Cl.
*G01R 33/565*   (2006.01)
*G01R 33/34*    (2006.01)
*G01R 33/3415*  (2006.01)
*G01R 33/36*    (2006.01)

(52) U.S. Cl.
CPC ........ *G01R 33/5659* (2013.01); *G01R 33/3664* (2013.01); *G01R 33/3415* (2013.01); *G01R 33/34076* (2013.01); *G01R 33/3657* (2013.01); *G01R 33/3678* (2013.01)

(58) Field of Classification Search
CPC ...................... G01R 33/5659; G01R 33/34076; G01R 33/3415; G01R 33/3657; G01R 33/3664; G01R 33/3678
See application file for complete search history.

(56) References Cited

U.S. PATENT DOCUMENTS

| | | | |
|---|---|---|---|
| 4,628,264 A * | 12/1986 | Rzedzian | 324/322 |
| 2007/0293916 A1* | 12/2007 | Peterchev | 607/61 |
| 2013/0119929 A1* | 5/2013 | Partovi | 320/108 |

FOREIGN PATENT DOCUMENTS

WO    WO 2008/100546 A1    8/2008

OTHER PUBLICATIONS

Schmitt M., et al., "Improved uniformity of RF-distribution in clinical whole body-imaging at 3T by means of dielectric pads", Proceedings International Society of Magnetic Resonance in Medicine 11, p. 197, 2004.

(Continued)

*Primary Examiner* — Dixomara Vargas
(74) *Attorney, Agent, or Firm* — Miles & Stockbridge P.C.

(57) ABSTRACT

There is provided a technique for improving quality of images obtained with an MRI apparatus by using the geometric structures of the conventional RF transmission coil and RF reception coil and without increasing burden on patients or MRI technicians. A conductor loop of an RF reception coil disposed between a subject and an RF transmission coil is used also as a loop for magnetic field adjustment in order to shield or enhance a rotating magnetic field $B_1$ generated by the RF transmission coil. Further, the conductor loop operated as a conductor loop for magnetic field adjustment among the conductor loops constituting the RF reception coil is driven so that inhomogeneity of the rotating magnetic field $B_1$ is reduced.

14 Claims, 23 Drawing Sheets

(56) References Cited

OTHER PUBLICATIONS

Schmitt M., et al., "B1-Homogenization in abdominal imaging at 3T by means of coupling coils", Proceedings of International Society of Magnetic Resonance in Medicine 13, p. 331, 2005.

Wiggins, G. C., et al, "B1 Transmit Field Manipulation at 7 Tesla Using Controlled Decoupling of Array Coil Elements (CODACE)," Proceedings of International Society of Magnetic Resonance in Medicine 15, p. 1054, 2007.

Merkle, H., et al., "B1 Transmit Field correction at 7T using Coupled Inner Elements", Proceedings of International Society of Magnetic Resonance in Medicine 16, p. 1085, 2008.

* cited by examiner

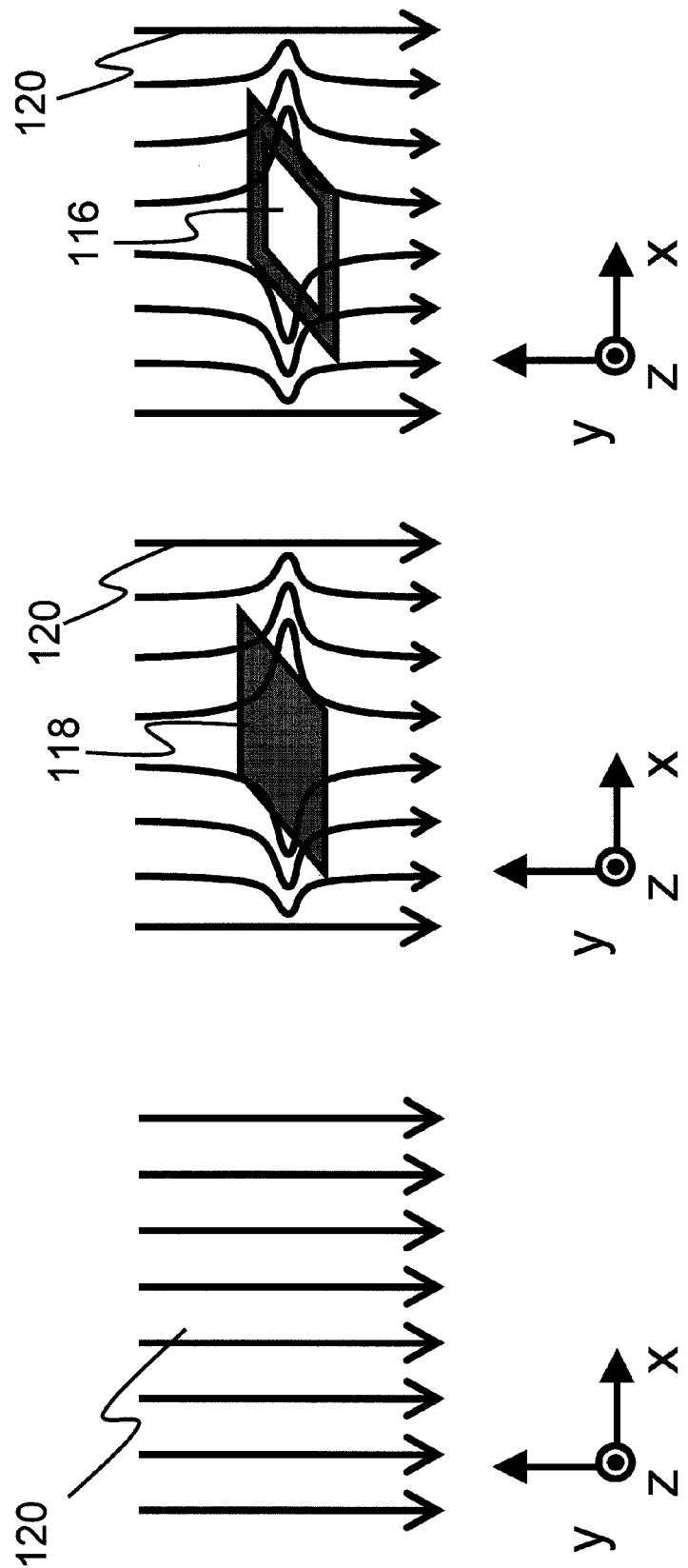

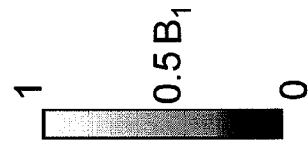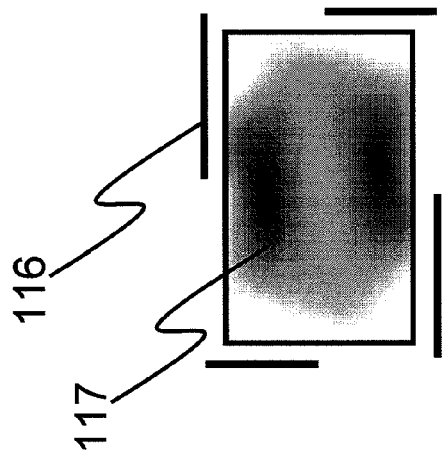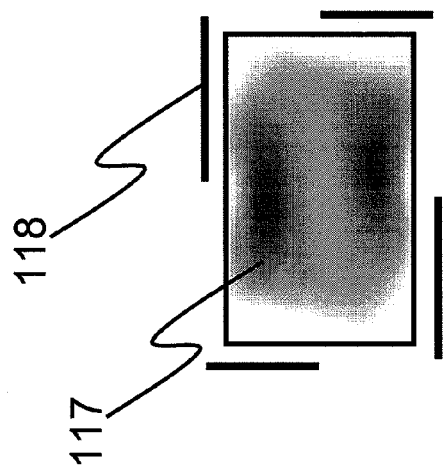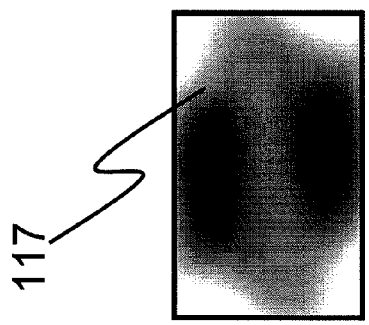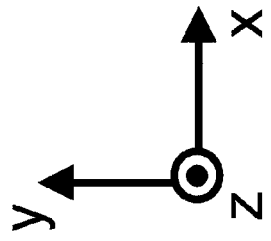

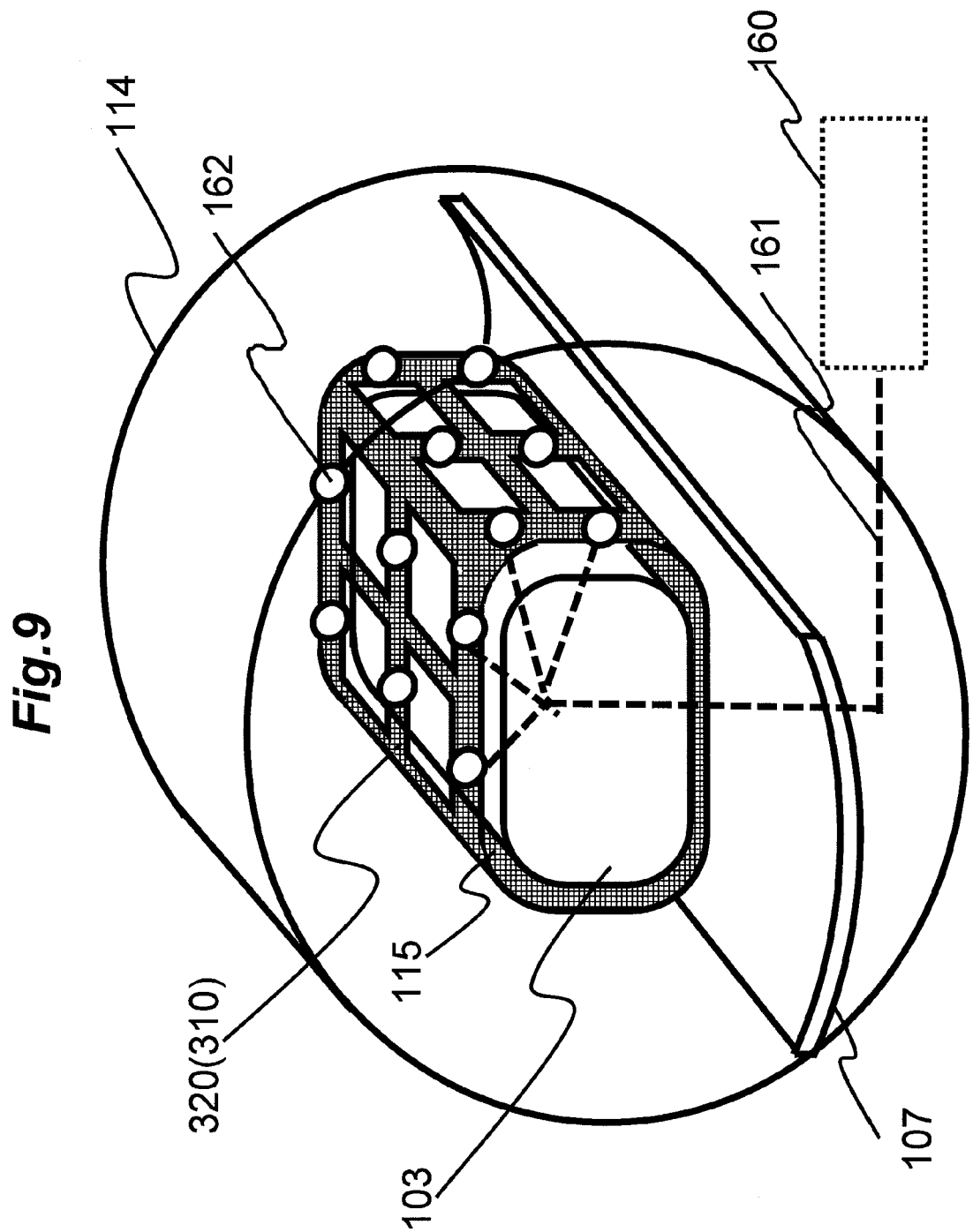

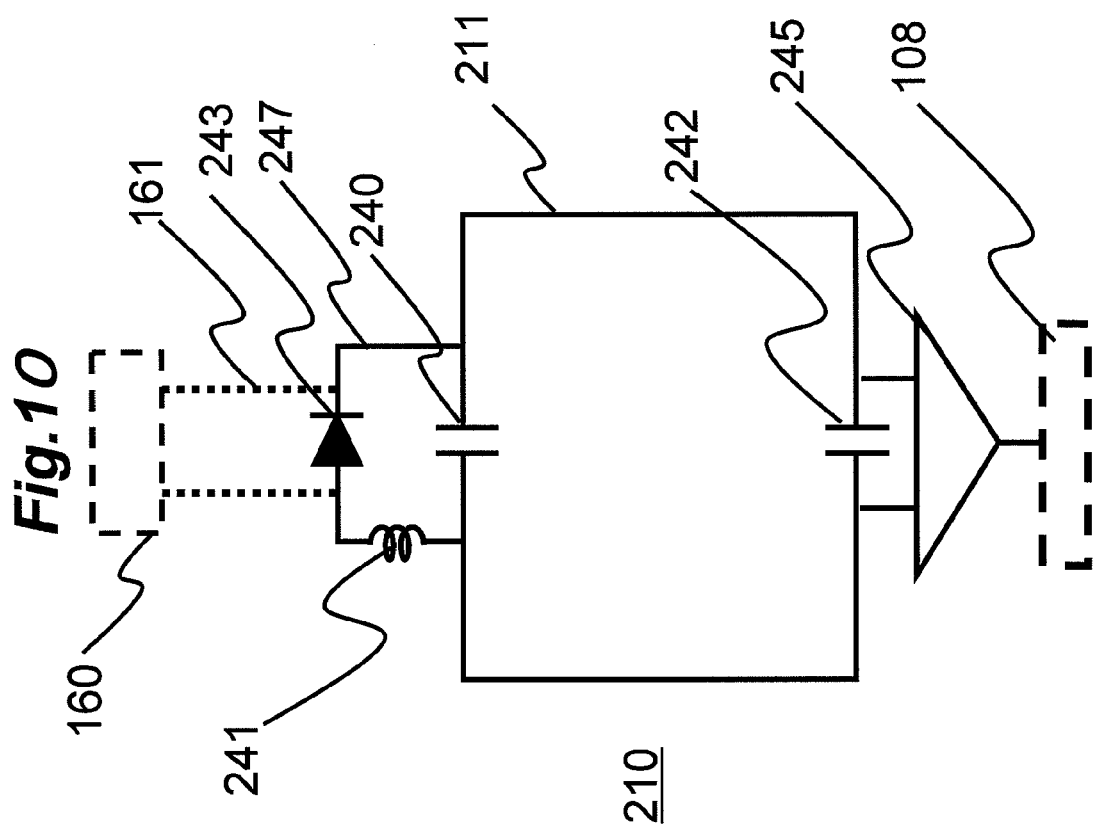

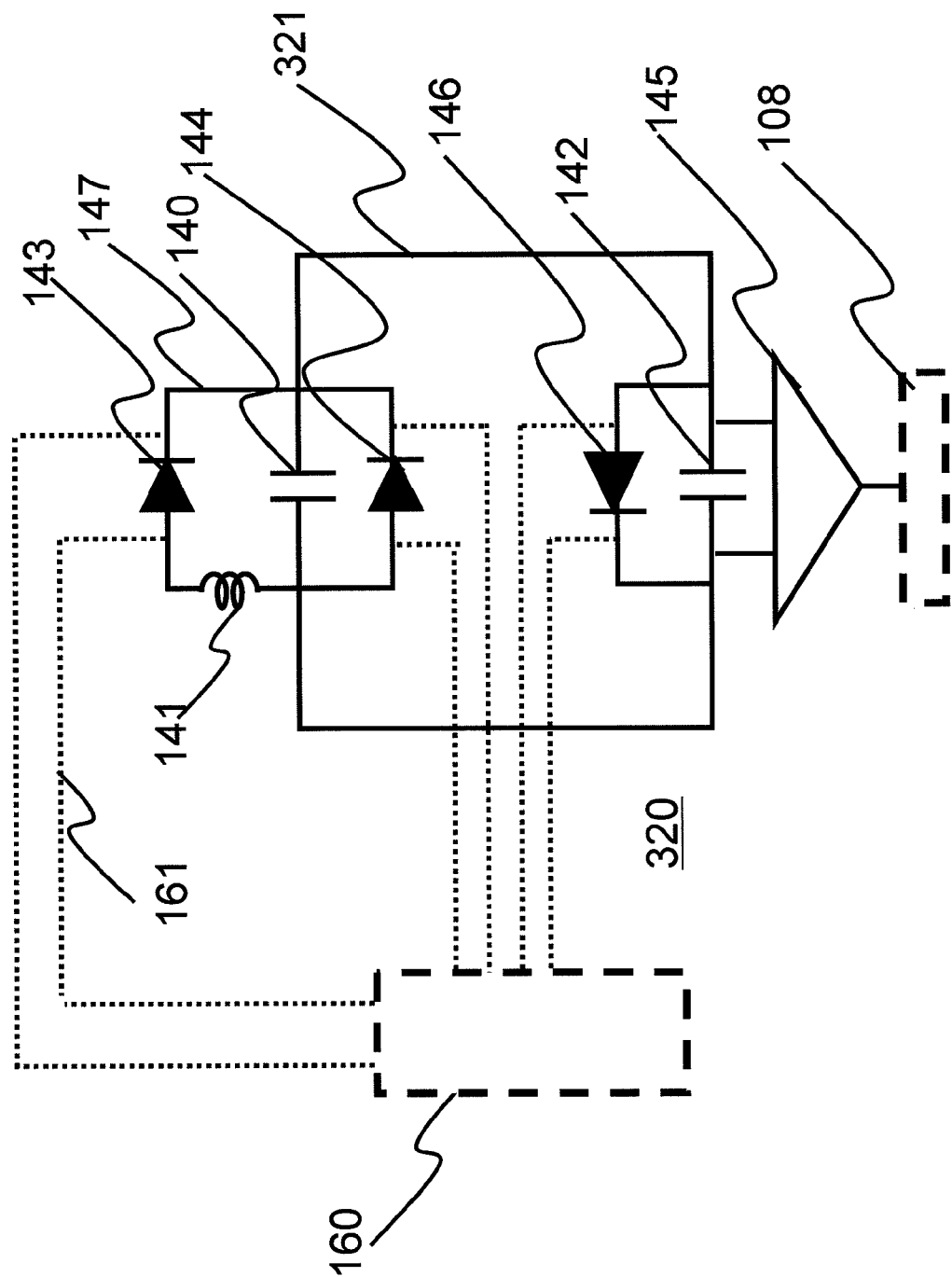

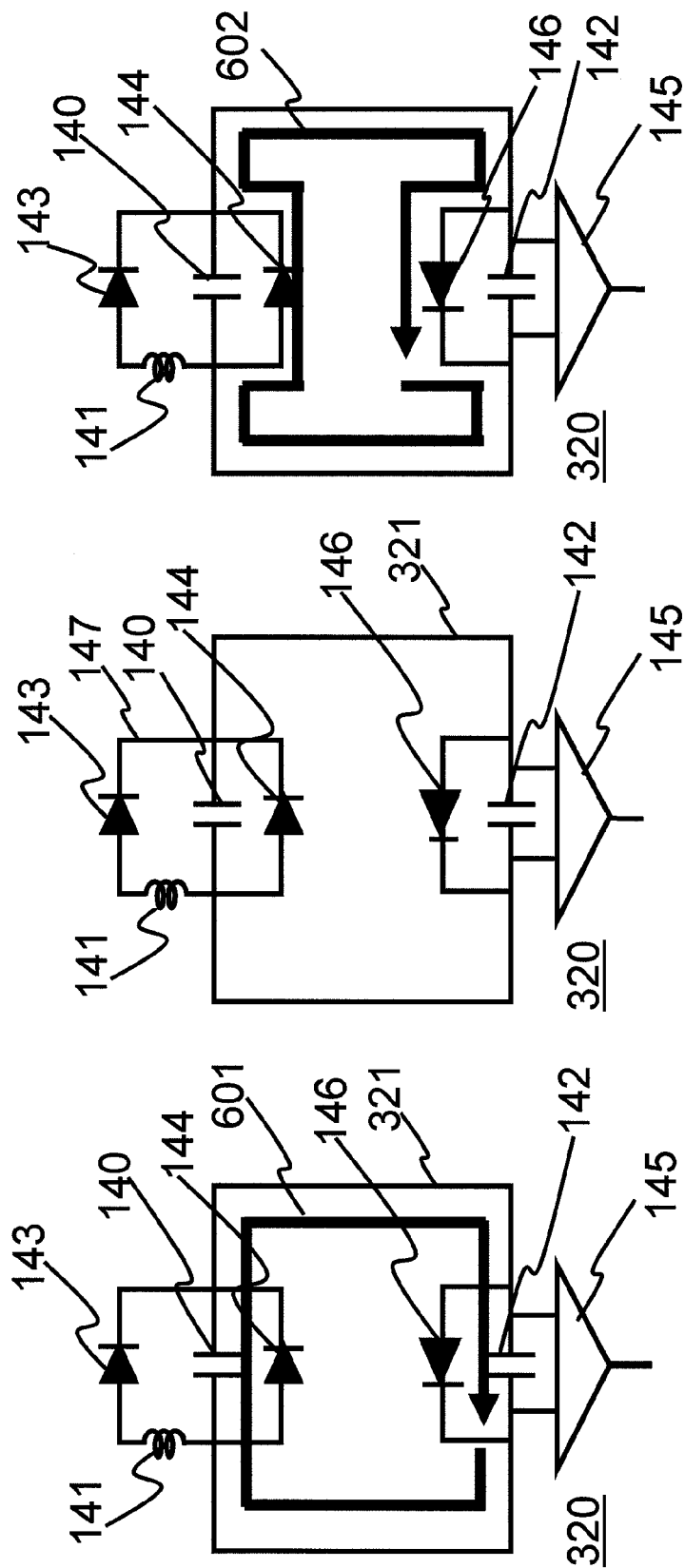

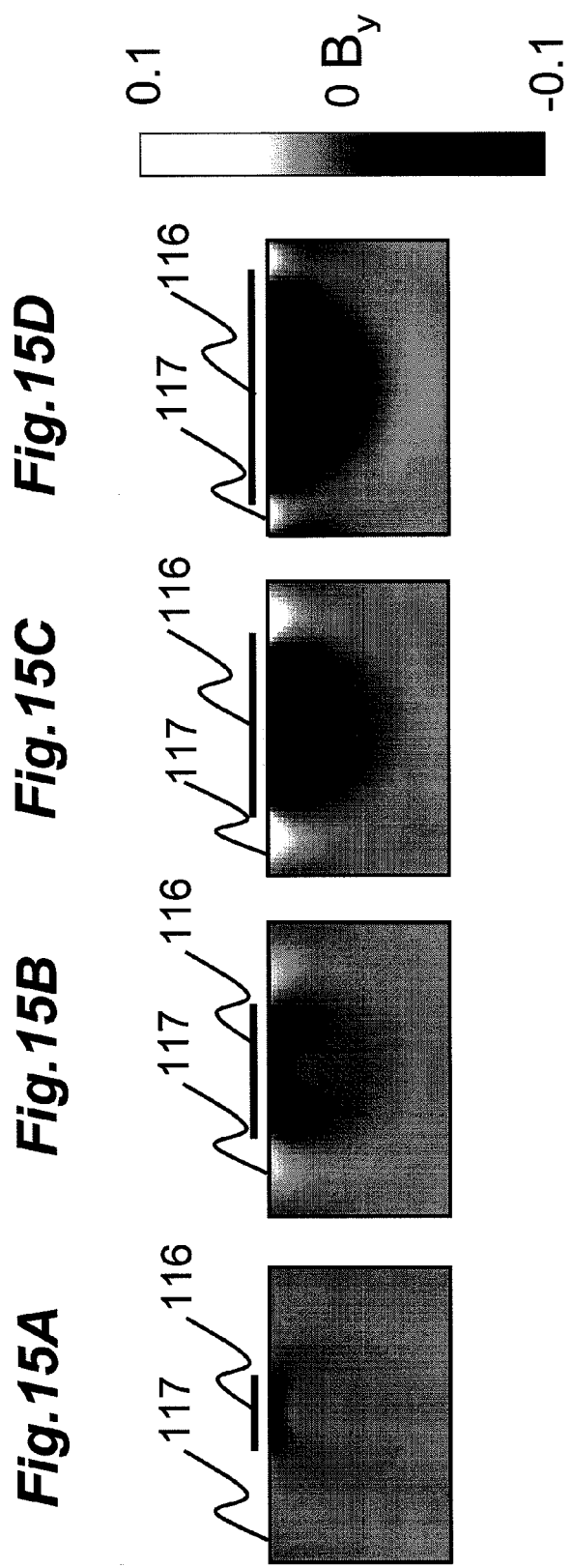

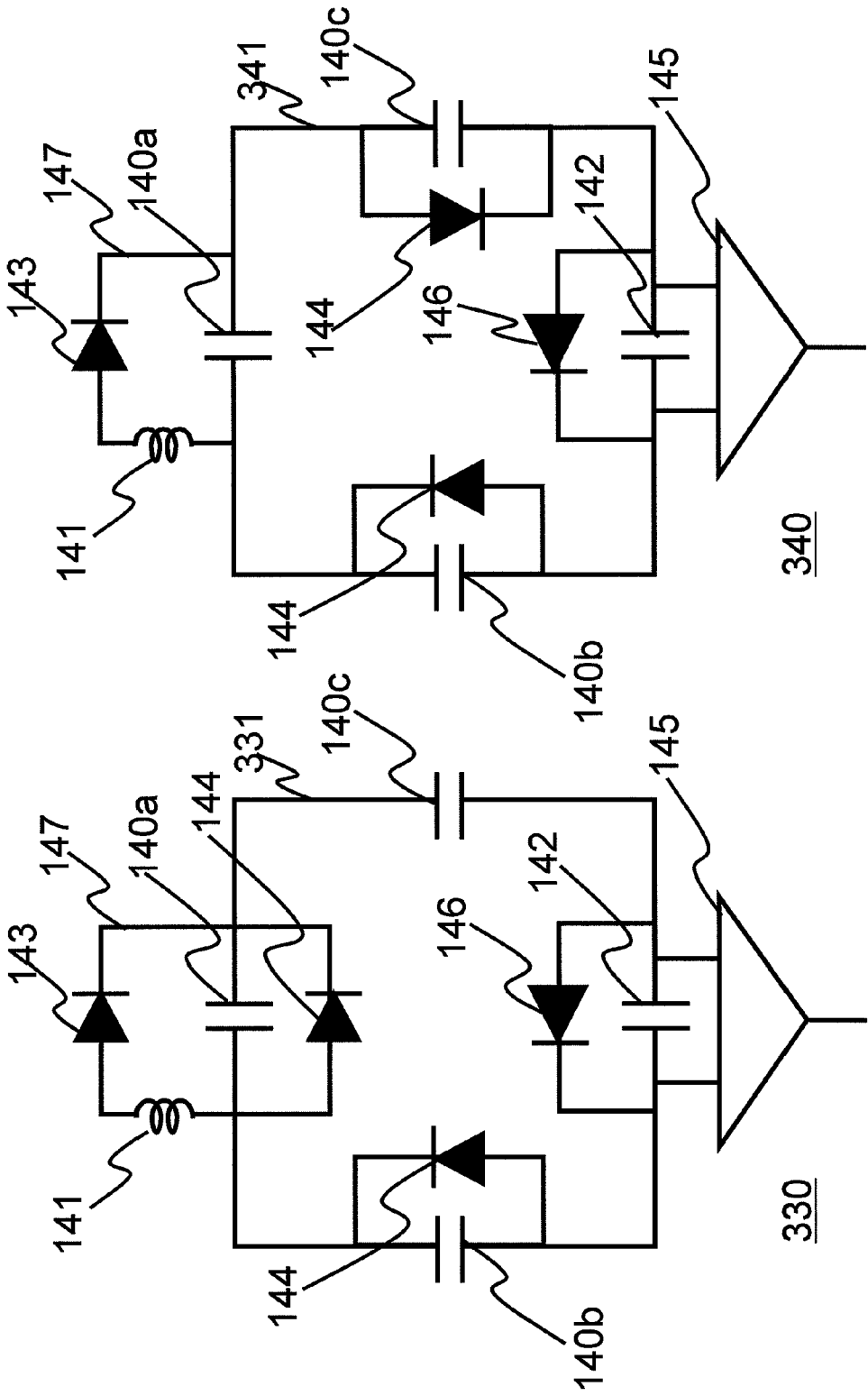

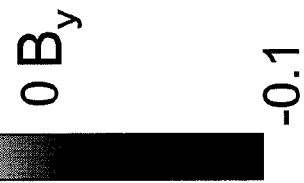
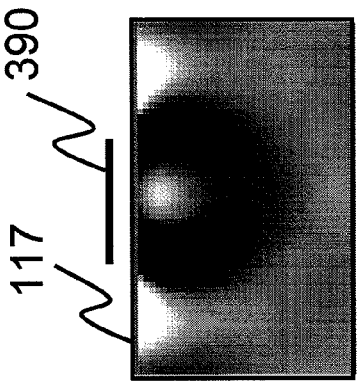
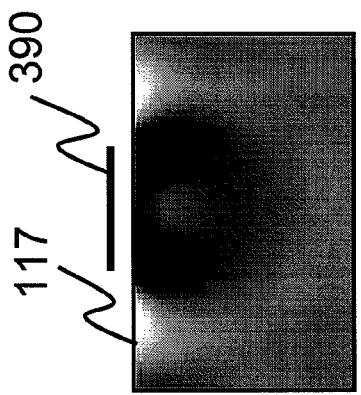
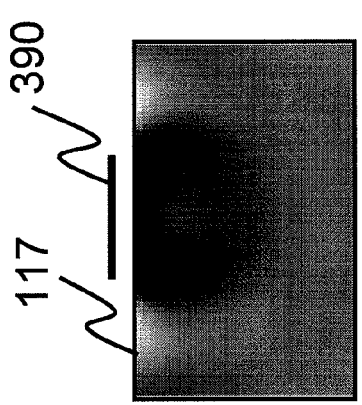
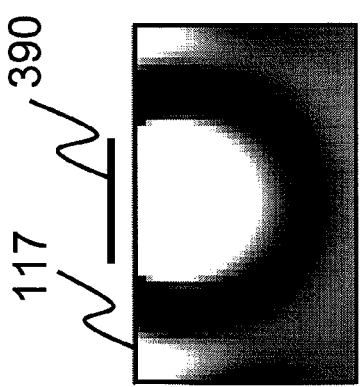
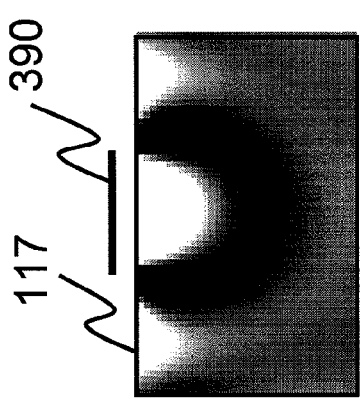

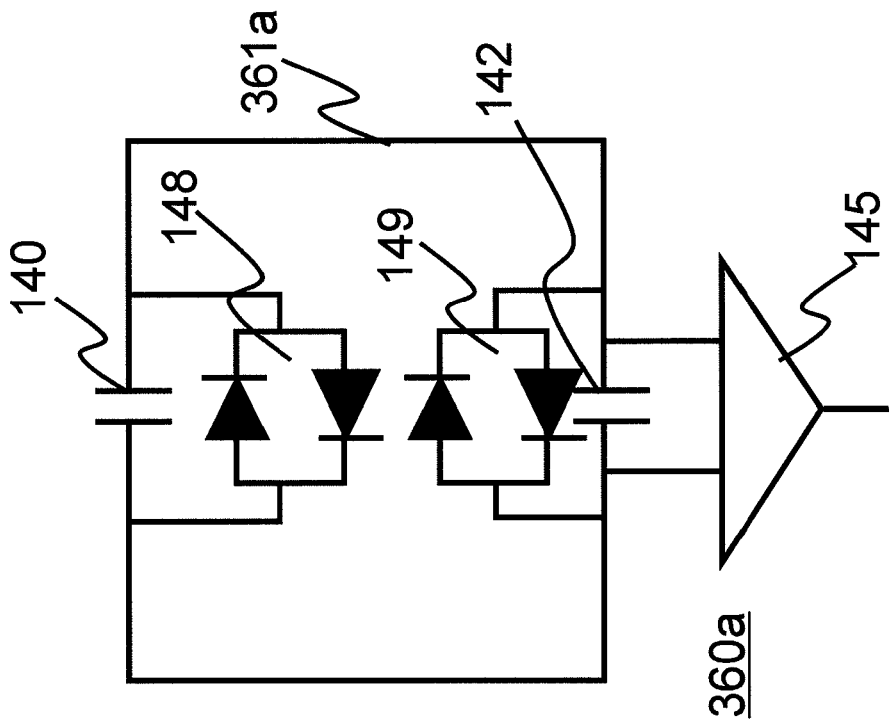
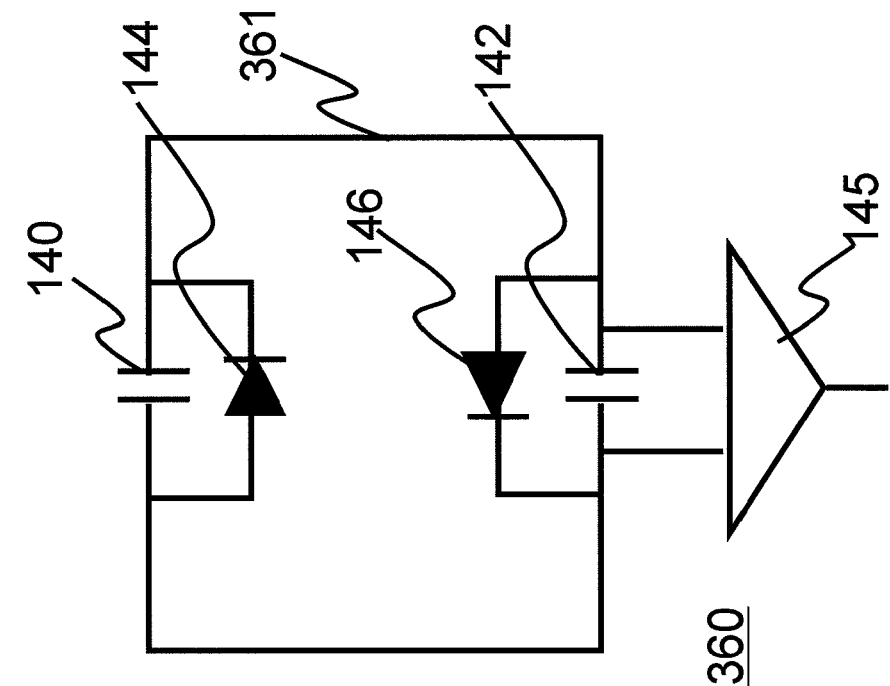

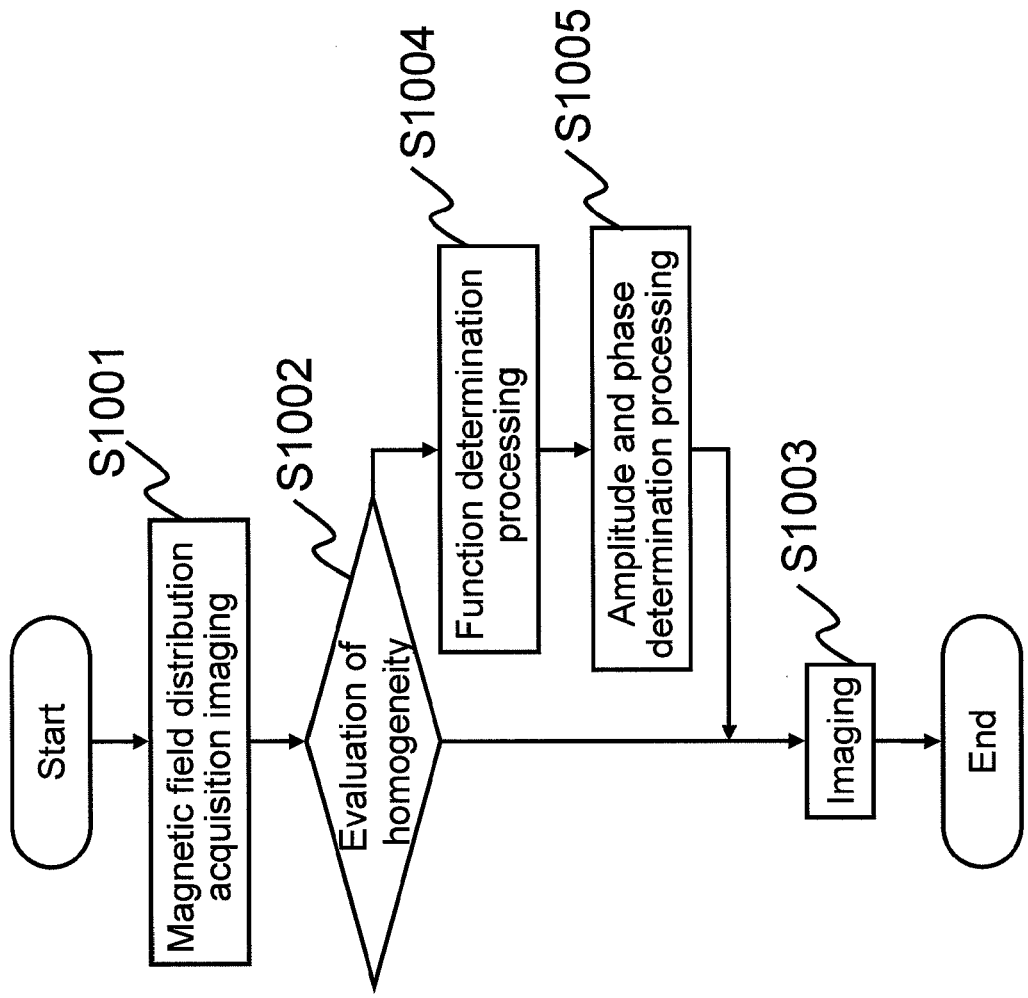

RF RECEPTION COIL AND MAGNETIC RESONANCE IMAGING APPARATUS USING SAME

TECHNICAL FIELD

The present invention relates to a magnetic resonance imaging (MRI) technique. In particular, the present invention relates to a technique for adjusting spatial distribution of a rotating magnetic field that induces a magnetic resonance phenomenon.

BACKGROUND ART

MRI apparatuses are medical diagnostic imaging apparatuses that induce a nuclear magnetic resonance phenomenon in atomic nuclei in an arbitrary cross-section of a subject, and obtain a tomographic image of the section from generated magnetic resonance signals. The apparatuses transmit a radio frequency wave (henceforth referred to as radio frequency wave or RF), which is a kind of electromagnetic wave, to a subject to excite nuclear spins in the subject, then receive magnetic resonance signals generated by the nuclear spins, and construct images of the subject. The transmission is performed with an RF transmission coil, and the reception is performed with an RF reception coil.

In recent years, in order to improve SNR (signal to noise ratio) of images, static magnetic field intensity used in MRI apparatuses has tended to increase, and high magnetic field MRI apparatuses using a static magnetic field intensity of about 3 T (tesla) (3T MRI apparatuses) have begun to spread. However, use of higher static magnetic field intensity more easily invites unevenness of obtained images. This is because a higher frequency of RF is used for inducing the magnetic resonance phenomenon with use of higher magnetic field intensity. In 3T MRI apparatuses, RF having a frequency of 128 MHz is used. The wavelength of this RF in living bodies is about 30 cm, which is in substantially the same scale as a section of the abdominal part, and thus phase of RF changes in the living bodies. Therefore, irradiated RF distribution and spatial distribution of a rotating magnetic field (henceforth referred to as $B_1$) that is generated by the RF and induces the magnetic resonance phenomenon become inhomogeneous, and unevenness of the image is generated. Under such a current circumstance, there is desired a technique for reducing inhomogeneity in distribution of the rotating magnetic field $B_1$ at the time of the RF irradiation performed in high magnetic field MRI apparatuses, in order to improve image quality.

As a method for reducing the inhomogeneity of $B_1$ distribution, use of a "dielectric pad" has been proposed (refer to, for example, Non-patent document 1). That is, a pad having a certain dielectric constant is placed on an imaging part, such as the abdominal part, to change the $B_1$ distribution in the abdominal part and thereby attain an effect of shifting position of a part of low $B_1$ intensity.

Research has also been done on putting a coupling coil on the abdominal part (refer to Patent document 1 and Non-patent document 2). That is, by placing a coupling coil near a part of low $B_1$ intensity in a section of the abdominal part, an effect of increasing the $B_1$ intensity is obtained.

PRIOR ART REFERENCES

Patent Document

Patent document 1: WO2008/100546

Non-Patent Documents

Non-patent document 1: Schmitt M., et al., Improved uniformity of RF-distribution in clinical whole body-imaging at 3T by means of dielectric pads, Proceedings International Society of Magnetic Resonance in Medicine, p. 197, 2004

Non-patent document 2: Schmitt M., et al., $B_1$-Homogenization in abdominal imaging at 3T by means of coupling coils, Proceedings of International Society of Magnetic Resonance in Medicine, p. 331, 2005

SUMMARY OF THE INVENTION

Object to be Achieved by the Invention

According to Non-patent document 1, by putting a dielectric pad on the abdominal part, an effect of reducing inhomogeneity of $B_1$ is obtained. However, the dielectric pad has a weight of several kilograms, and therefore it places a burden on patients. Further, depending on a sequence to be used, the dielectric pad itself is imaged in white in the MRI images, and thus may inhibit the diagnosis.

According to Patent document 1 and Non-patent document 2, the coupling coil is lighter (0.5 kg at most) than the dielectric pad, and is not imaged in white in MRI images like the dielectric pad. However, when the coupling coil is used, difference in positional relationship between the coupling coil and the abdominal part may invite difference in the resonance frequency of the coupling coil, which leads to difference in the effect of reducing inhomogeneity of B. Although the resonance frequency of the coupling coil can be changed by changing values of resistances, capacitors, inductors etc. disposed in the coupling coil, a mechanism for changing the values is needed in such a case, and the circuit structure becomes complicated. Further, the coupling coil is required in addition to the transmit RF coil and the receive RF coil, and the configuration becomes complicated.

Furthermore, when a dielectric pad or a coupling coil is used, MRI technicians are required to determine positioning of these at the time of imaging, and it requires time and effort, and imposes a burden on the technicians.

The present invention was accomplished in light of the above-mentioned circumstances, and an object thereof is to provide a technique for improving quality of images obtained with an MRI apparatus by using the geometric structures of the current RF transmission coil and RF reception coil without increasing burden on patients and MRI technicians.

Means for Achieving the Object

According to the present invention, a conductor loop of an RF reception coil is utilized also as a conductor loop for magnetic field adjustment to be disposed between a subject and an RF transmission coil in order to shield or enhance the rotating magnetic field $B_1$ generated by the RF transmission coil. Further, the conductor loop operated as a conductor loop for magnetic field adjustment among the conductor loops constituting the RF reception coil is driven so that inhomogeneity of the rotating magnetic field $B_1$ is reduced.

Specifically, there is provided a conductor loop disposed in a magnetic resonance imaging apparatus provided with an RF transmission coil that transmits a radio frequency signal to a subject placed in a static magnetic field, wherein the conductor loop is disposed in a bore formed by the RF transmission coil, and comprises a switch circuit for controlling electrical connection, and when the switch circuit is driven, the switch circuit makes the conductor loop function as a magnetic field adjustment circuit that shields or enhances a magnetic field generated by the RF transmission coil. Further, this conductor loop is disposed so as to reduce inhomogeneity in distribution of the magnetic field when the switch circuit is driven. Furthermore, the conductor loop is provided with at least one capacitor, and value of the capacitor is adjusted so that, in a state that the switch circuit is not driven, resonance frequency of the conductor loop corresponds to frequency of a magnetic resonance signal generated from the subject in response to receiving the radio frequency signal.

There is also provided an RF reception coil for receiving a magnetic resonance signal generated from a subject in response to receiving a radio frequency signal transmitted by an RF transmission coil in a magnetic resonance imaging apparatus, wherein the RF reception coil is disposed in a bore formed by the RF transmission coil, and comprises a plurality of conductor loops, at least one of the conductor loops comprises at least one capacitor and a switch circuit connected to the capacitor in parallel, and when the switch circuit is driven, the switch circuit makes the conductor loop having the switch circuit function as a magnetic field adjustment circuit that shields or enhances a magnetic field generated by the RF transmission coil.

There is also provided a magnetic resonance imaging apparatus comprising a static magnetic field formation means for forming a static magnetic field, a gradient magnetic field application means for applying a gradient magnetic field, a radio frequency signal transmission means for transmitting a radio frequency signal to a subject, a magnetic resonance signal reception means for detecting a magnetic resonance signal generated from the subject, and a control means for controlling the gradient magnetic field application means, the radio frequency signal transmission means, and the magnetic resonance signal reception means, wherein the magnetic resonance signal reception means consists of the above-mentioned RF reception coil.

Effect of the Invention

According to the present invention, quality of images obtained with an MRI apparatus can be improved by using the geometric structures of the conventional RF transmission coil and RF reception coil without increasing burden on patients or MRI technicians.

BRIEF DESCRIPTION OF THE DRAWINGS

FIG. 5A is an explanatory drawing for explaining influence of the conductor plate or conductor loop on magnetic flux.

FIG. 5B is an explanatory drawing for explaining influence of the conductor plate or conductor loop on magnetic flux.

FIG. 5C is an explanatory drawing for explaining influence of the conductor plate or conductor loop on magnetic flux.

FIG. 8A shows a result of simulation of the rotating magnetic field distribution in the case where conductor plates and conductor loops are not disposed.

FIG. 8B shows a result of simulation of the rotating magnetic field distribution in the case where conductor plates are disposed as shown in FIG. 7A.

FIG. 8C shows a result of simulation of the rotating magnetic field distribution in the case where conductor loops are disposed as shown in FIG. 7B.

FIG. 9 is an explanatory drawing for explaining exemplary configuration and disposition of an RF reception coil according to the first embodiment.

FIG. 10 is a circuit diagram of a conductor loop constituting an RF reception coil.

FIG. 11 is a circuit diagram of a conductor loop constituting a reception coil according to the first embodiment.

FIG. 12A is an explanatory drawing for explaining flow of electric current at the time of realizing the reception function of the conductor loop according to the first embodiment.

FIG. 12B is an explanatory drawing for explaining flow of electric current at the time of realizing the magnetic decoupling function of the conductor loop according to the first embodiment.

FIG. 12C is an explanatory drawing for explaining flow of electric current at the time of realizing the magnetic field control function of the conductor loop according to the first embodiment.

FIG. 15A is an explanatory drawing showing one of the results of simulation for change of magnetic field distribution at the time of changing size of conductor loop.

FIG. 15B is an explanatory drawing showing one of the results of simulation for change of magnetic field distribution at the time of changing size of conductor loop.

FIG. 15C is an explanatory drawing showing one of the results of simulation for change of magnetic field distribution at the time of changing size of conductor loop.

FIG. 15D is an explanatory drawing showing one of the results of simulation for change of magnetic field distribution at the time of changing size of conductor loop.

FIG. 16A is a circuit diagram of a conductor loop according to the second embodiment.

FIG. 16B is a circuit diagram of a conductor loop according to the second embodiment.

FIG. 17A is an explanatory drawing showing one of the results of simulation for change of magnetic field distribution at the time of changing number of diodes in the conductor loop.

FIG. 17B is an explanatory drawing showing one of the results of simulation for change of magnetic field distribution at the time of changing number of diodes in the conductor loop.

FIG. 17C is an explanatory drawing showing one of the results of simulation for change of magnetic field distribution at the time of changing number of diodes in the conductor loop.

FIG. 17D is an explanatory drawing showing one of the results of simulation for change of magnetic field distribution at the time of changing number of diodes in the conductor loop.

FIG. 17E is an explanatory drawing showing one of the results of simulation for change of magnetic field distribution at the time of changing number of diodes in the conductor loop.

FIG. 19A is a circuit diagram of a conductor loop according to the third embodiment.

FIG. 19B is a circuit diagram of a conductor loop according to the third embodiment.

FIG. 23 is a flowchart of a modification of imaging processing according to the fourth embodiment.

MODES FOR CARRYING OUT THE INVENTION

Hereafter, embodiments of the conductor loop of the present invention and magnetic resonance imaging apparatus using it will be explained in detail. However, the present invention is not limited to these embodiments.

<<First Embodiment>>

Figure 1:
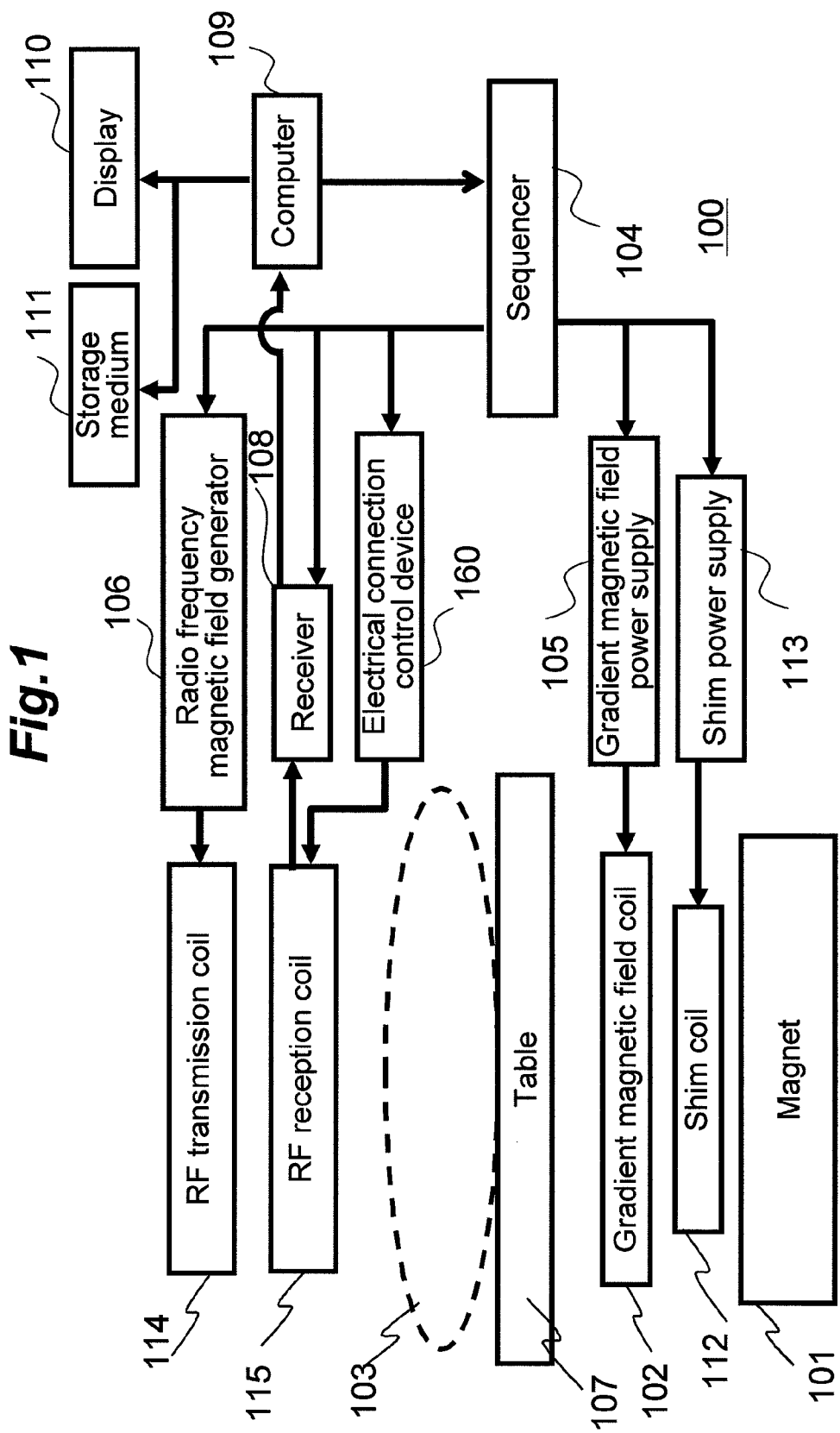
FIG. 1 is a block diagram of an MRI apparatus according to the first embodiment.

The first embodiment of the present invention will be explained below. First, entire configuration of an MRI apparatus according to the first embodiment will be explained. FIG. 1 is a block diagram of an MRI apparatus 100 according to this embodiment. As shown in this drawing, the MRI apparatus 100 according to this embodiment is provided with a magnet 101 for generating a static magnetic field, a gradient magnetic field coil 102 for generating a gradient magnetic field, a sequencer 104, an RF transmission coil 114 for transmitting a radio frequency magnetic field, an RF reception coil 115 for receiving a magnetic resonance signal generated from a subject 103, a table 107 for placing the subject 103, a gradient magnetic field power supply 105 and a radio frequency magnetic field generator 106 for generating a gradient magnetic field and a radio frequency magnetic field according to commands from the sequencer 104, respectively, a receiver 108 for detecting a magnetic resonance signal received by the RF reception coil 115, and a computer 109 for controlling operation of the whole MRI apparatus 100.

The gradient magnetic field coil 102 is connected to the gradient magnetic field power supply 105. The RF transmission coil 114 and the RF reception coil 115 are connected to the radio frequency magnetic field generator 106 and the receiver 108, respectively. The sequencer 104 sends commands to the gradient magnetic field power supply 105 and the radio frequency magnetic field generator 106 to make them generate a gradient magnetic field and a radio frequency magnetic field, respectively. The radio frequency magnetic field is irradiated on the subject 103 via the RF transmission coil 114. A magnetic resonance signal generated from the subject 103 upon irradiation of the radio frequency magnetic field (transmission of an RF signal) is received by the RF reception coil 115, and detection is performed by the receiver 108. The magnetic resonance frequency used as the basis of the detection performed by the receiver 108 is set by the computer 109 through the sequencer 104. The detected signal is sent to the computer 109 via an A/D conversion circuit, and signal processing such as image reconstruction is performed therein. The results are displayed on a display 110 of the computer 109. The detected signal and measurement conditions are saved in a storage medium 111 provided in the computer 109 as required. Further, the sequencer 104 usually control the parts so that they operate at timings and intensities programmed beforehand.

A shim coil 112 for adjusting homogeneity of the static magnetic field and a shim power supply 113 for making the shim coil 112 generate a magnetic field according to a command sent from the sequencer 104 may be further provided.

Further, the RF reception coil 115 according to this embodiment is constituted by a plurality of conductor loops. Each of the conductor loops has a switch circuit, and realizes, in addition to a signal reception function (first function) and a magnetic decoupling function (second function), which are function of usual RF reception coils, a function of adjusting distribution of the rotating magnetic field $B_1$ (third function). The function of adjusting distribution of the rotating magnetic field $B_1$ is realized at the time of RF transmission. Which function is realized is determined by switching the switch circuit with a control signal. The MRI apparatus 100 according to this embodiment is further provided with an electrical connection control device 160 for receiving a command from the sequencer 104 and transmitting a control signal to the conductor loops.

Figure 2:
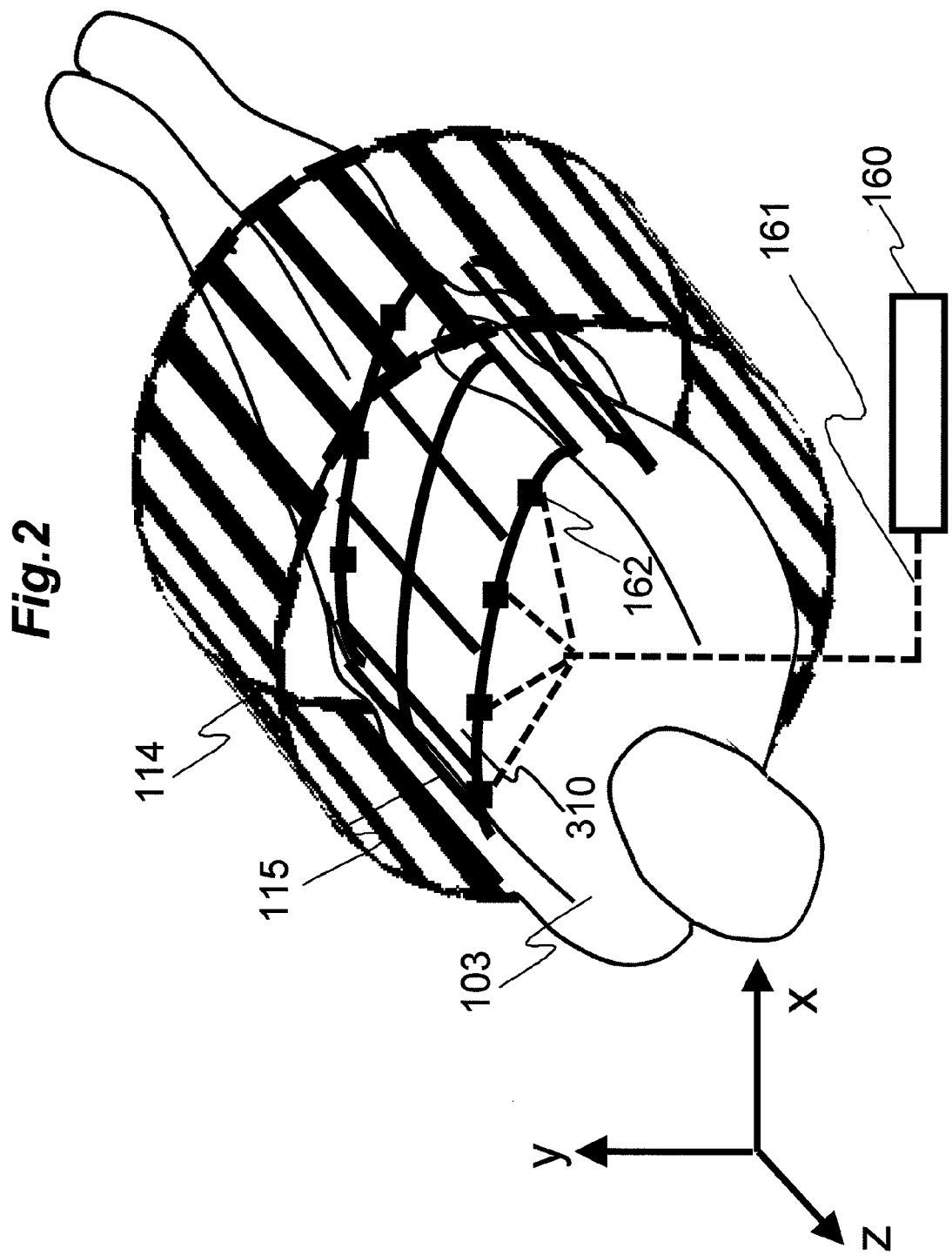
FIG. 2 is an explanatory drawing for explaining an example of disposition of an RF coil according to the first embodiment.

Hereafter, the details of the RF reception coil 115 according to this embodiment will be explained. FIG. 2 shows a typical example of disposition of the RF transmission coil 114 and the RF reception coil 115 for a case of imaging a human abdominal region with the MRI apparatus 100. In this drawing, the z-axis direction of the coordinate system is the direction of the static magnetic field. The same shall apply to all the drawings referred to hereafter.

As shown in FIG. 2, at the time of imaging, the subject 103 is inserted into the RF transmission coil 114, and RF transmission is performed to obtain an image. The RF transmission coil 114 shown in FIG. 2 is one called birdcage coil, and the shape of this coil is a common shape as the RF transmission coil of the MRI apparatus 100. Further, as shown in FIG. 2, in order to receive a magnetic resonance signal from the inside of the subject 103 at a high sensitivity at the time of RF reception, the RF reception coil 115 is set at a position as near the subject 103 as possible in many cases.

The RF reception coil 115 according to this embodiment has a structure that a lot of conductor loops 310 are disposed in the shape of an array as shown in FIG. 2. The RF reception coil 115 having such a shape can receive magnetic resonance signals from various parts of living bodies at high sensitivity.

Each of the conductor loops 310 has a switch circuit 162. The ON/OFF control of this switch circuit 162 is carried out by the electrical connection control device 160, and it makes the conductor loop 310 have different functions. In this embodiment, a diode is used as the switch circuit 162. The electrical connection control device 160 transmits a control signal to the diode through a conductor wire 161 for electrical connection control and drives the diode (makes it to be in the ON state).

Prior to detailed explanation of the configuration and operation of the RF reception coil 115, it will be explained that, by disposing a conductor loop between the RF transmission coil 114 and the subject 103, inhomogeneity in distribution of the rotating magnetic field $B_1$ generated by the RF transmission coil 114 can be reduced, with reference to results of an electromagnetic field analysis simulation. In this explanation, a birdcage coil 119 is used as the RF transmission coil 114.

Figure 3B:
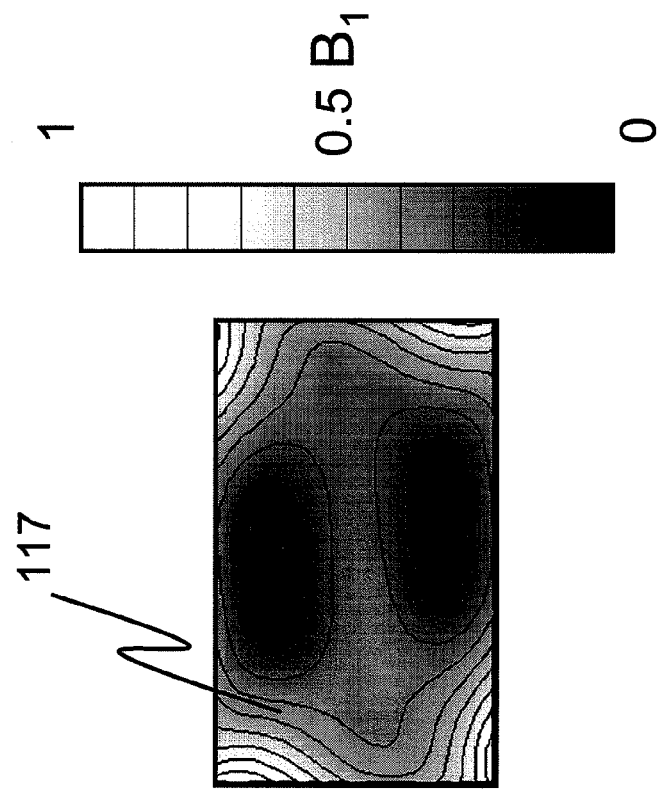
FIG. 3B is an explanatory drawing for explaining results of simulation for distribution of a rotating magnetic field generated in a phantom.
Figure 3A:
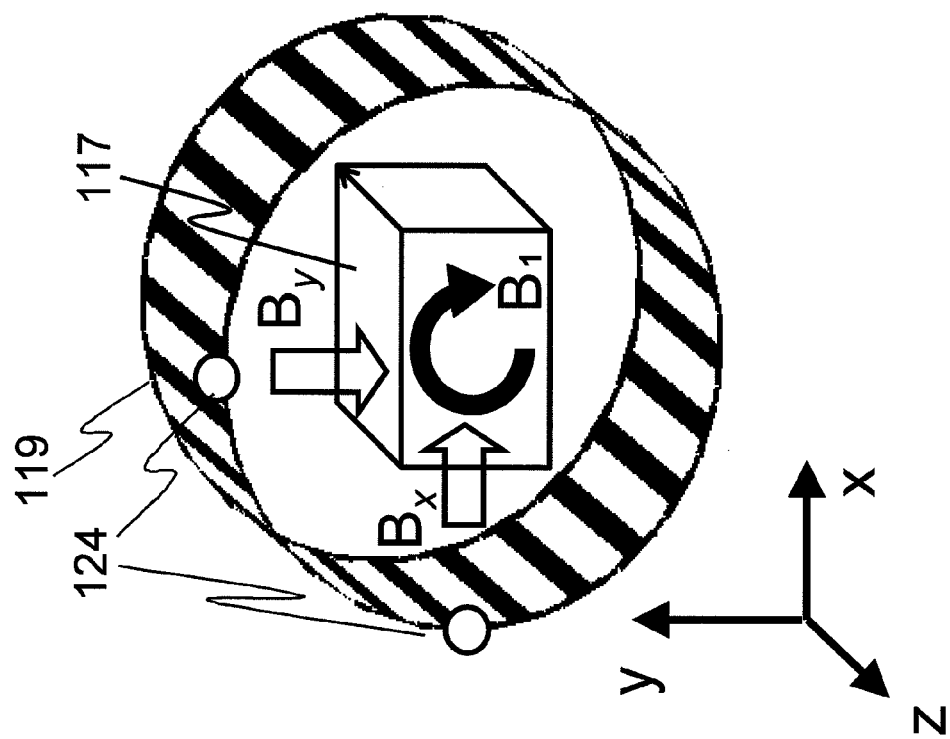
FIG. 3A is an explanatory drawing for explaining a rotating magnetic field generated by a birdcage coil.

First, the principle based on which presence of a conductor changes distribution of the rotating magnetic field $B_1$ will be explained. A rotating magnetic field $B_1$ generated in a phantom 117 simulating the subject 103 at the time of transmitting an RF signal from the birdcage coil 119 to the phantom 117 is shown FIG. 3A and FIG. 3B. FIG. 3A shows a schematic view of the birdcage coil 119 and the phantom 117, and FIG. 3B shows distribution of the rotating magnetic field $B_1$ in the phantom 117. In addition, in FIG. 3B, intensity of the rotating magnetic field $B_1$ is non-dimensionalized so that the maximum $B_1$ intensity in the phantom 117 should become 1.

The phantom 117 had a rectangular parallelepiped shape, and the sizes thereof for the x, y and z-axis directions were 300 mm, 200 mm, and 300 mm, respectively. This shape was determined by supposing the abdominal part of a living body and simplifying it. Further, as physical properties of the phantom 117, an electric conductivity of 1.0 S/m and a dielectric constant of 80 were used. These were determined by supposing a water phantom showing physical properties close to those of living body.

As a coil for applying magnetic fluxes to this phantom 117, the birdcage coil 119 having 24 rungs was used. As for the size of the birdcage coil 119, the diameter was 615 mm, and the rung length for the z-axis direction was 400 mm. The frequency of the RF signal transmitted from the birdcage coil 119 was set to be 128 MHz by supposing a 3T MRI apparatus.

Further, feeding points 124 were provided at two positions in the birdcage coil 119. By supplying electric power in a sine wave form to the feeding points 124, the birdcage coil 119 generates two magnetic fluxes perpendicular to each other, which are represented by the following equations (1) and (2).

$$Bx = A_1 \sin(\omega t + \phi_1) \quad (1)$$

$$By = A_2 \sin(\omega t + \phi_2) \quad (2)$$

With the above equations, the rotating magnetic field $B_1$ is represented by the following equation (3).

$$B_1 = (Bx + iBy)/2 \quad (3)$$

In order to most efficiently generate the rotating magnetic field $B_1$, the amplitude ratio of Bx and By ($A_2/A_1$) was set to be 1, and the phase difference ($\phi_2 - \phi_1$) was set to be $\Pi/2$. This is an RF irradiation method called QD (quadrature drive), and is a standard RF irradiation method.

The simulation was performed with disposing a cylindrical shield (not shown) having a diameter of 655 mm and a length of 900 mm for the z-axis direction outside the birdcage coil 119.

As shown in FIG. 3B, as a result of this simulation, two regions showing low rotating magnetic field $B_1$ intensity were observed at two positions on the upper and lower sides of the phantom 117, and regions showing high rotating magnetic field $B_1$ intensity were seen at four corners of the phantom 117. This inhomogeneity in distribution of the rotating magnetic field $B_1$ represents an example of general tendency of inhomogeneity in distribution of the rotating magnetic field $B_1$ produced in a section of the abdominal part of the subject 103.

As described above, the rotating magnetic field $B_1$ intensity significantly varies within the phantom 117, and becomes inhomogeneous. This is the $B_1$ inhomogeneity currently considered as a problem of high magnetic field MRI apparatuses. This phenomenon is induced because the frequency of RF is as high as 128 MHz, and thus the wavelength within the phantom 117 becomes as short as about 30 cm, and the RF wavelength becomes substantially the same as the size of the phantom 117. If the RF wavelength becomes substantially the same as the size of the phantom 117, when RF enters into the phantom 117 from the circumference and propagates in the phantom 117, the phase of RF significantly changes. Such RFs having different phases interfere one another to generate the inhomogeneity of the rotating magnetic field B.

Figure 4B:
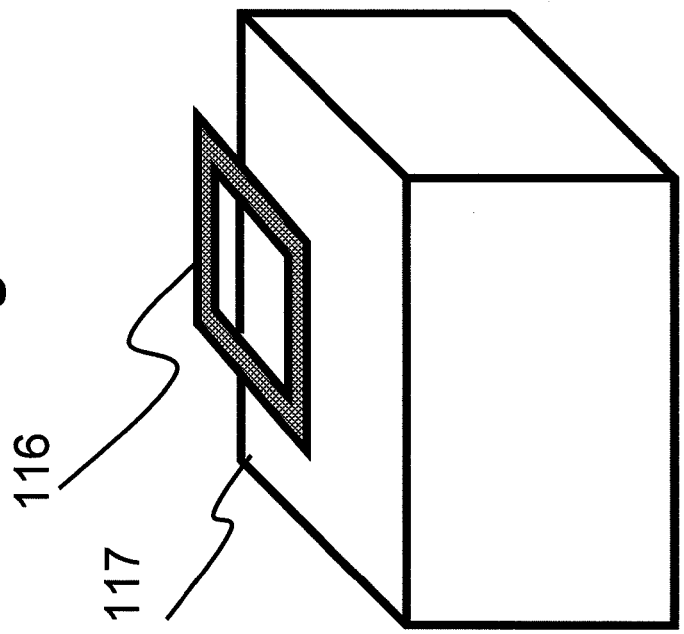
FIG. 4B is an explanatory drawing for explaining an example of disposition of the conductor loop.
Figure 4A:
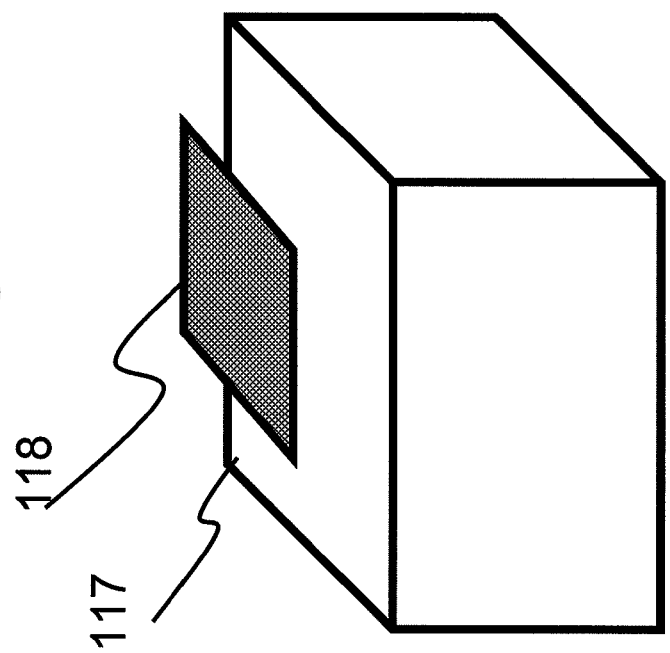
FIG. 4A is an explanatory drawing for explaining an example of disposition of a conductor plate in verification of the effect of the conductor plate.

In such a case, if a conductor is disposed in, for example, a region to which RF is transmitted, distribution of the rotating magnetic field $B_1$ in this region is changed. This is because an electric current flows in the conductor in such a direction that the magnetic field is compensated. The change of the rotating magnetic field $B_1$ in the case of disposing a conductor near the phantom 117 will be explained. Explanation will be made for a case, as an example, where a conductor plate 118 or a conductor loop 116 is disposed near the phantom 117 as shown in FIG. 4A and FIG. 4B.

Magnetic fluxes 120 generated by the birdcage coil 119 are shown in FIG. 5A to FIG. 5C. FIG. 5A is a schematic view of the magnetic fluxes 120 for a case where there is no conductor plate 118 or conductor loop 116, FIG. 5B is the same for a case where the conductor plate 118 is disposed, and FIG. 5C is the same for a case where the conductor loop 116 is disposed.

As shown in FIG. 5A, the birdcage coil 119 generates a linear magnetic field. In the case of FIG. 5B, the magnetic fluxes 120 of the linear magnetic field are significantly deformed by the conductor plate 118. This is because, if the conductor plate 118 is disposed in the magnetic field, an electric current flows in the conductor plate 118 in such a direction that the magnetic field is compensated. Due to this phenomenon, magnetic flux density becomes small in the center part of the conductor plate 118, and magnetic flux density becomes large at end parts of the conductor plate 118. Therefore, uneven magnetic flux densities can be generated by disposing the conductor plate 118 in the rotating magnetic field B. If it is taken into consideration that an electric current flowing in such a direction that a magnetic field is compensated flows at end parts of the conductor plate in a large amount, by disposing the conductor loop 116 in a linear magnetic field instead of the conductor plate 118 as shown in FIG. 5C, an electric current similarly flows in such a direction that the magnetic field is compensated, and uneven magnetic flux densities can be generated.

Figure 6B:
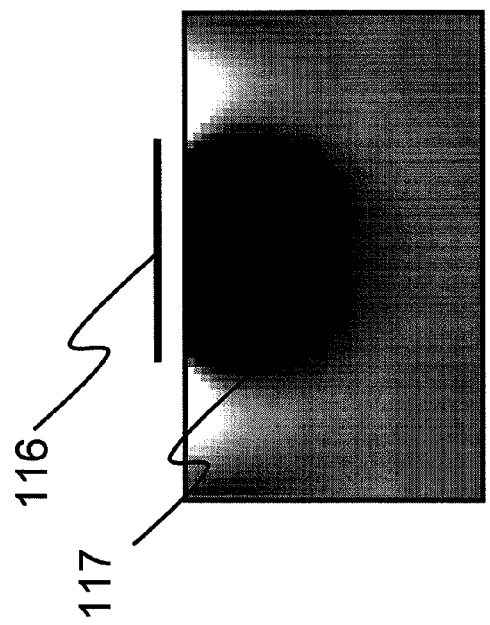
FIG. 6B is an explanatory drawing showing results of simulation for confirming change of rotating magnetic field in the case where a conductor plate or conductor loop is disposed near the phantom.
Figure 6A:
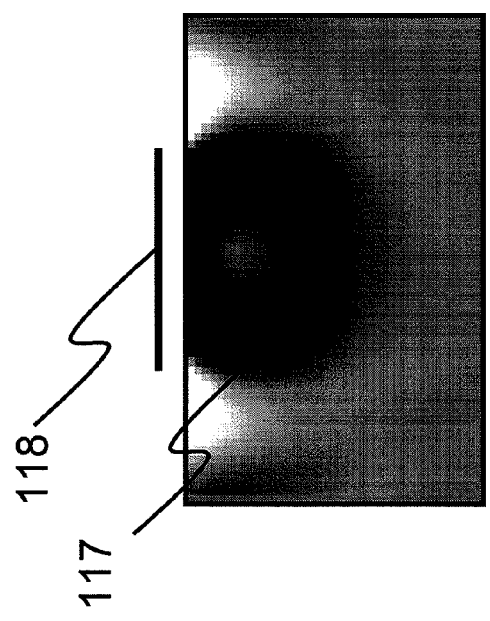
FIG. 6A is an explanatory drawing showing results of simulation for confirming change of rotating magnetic field in the case where a conductor plate or conductor loop is disposed near the phantom.

There are shown results of electromagnetic field analysis simulation for degree of change of the magnetic field in the phantom 117 in the cases where the conductor plate 118 and the conductor loop 116 were disposed as shown in FIG. 5A to FIG. 5C. Changes of the magnetic field for the cases where the conductor plate 118 or the conductor loop 116 was disposed near the phantom 117 are shown in FIG. 6A and FIG. 6B. FIG. 6A shows the result for the case where the conductor plate 118 was disposed, and FIG. 6B shows the result for the case where the conductor loop 116 was disposed.

The conditions used for the above simulation are shown below. The shape of the phantom 117 used in the simulation was the same rectangular parallelepiped shape as that shown in FIG. 3B, the sizes thereof for the x, y and z-axis directions were 300 mm, 200 mm, and 300 mm, respectively, which were also the same as those of the phantom shown in FIG. 3B. Further, physical properties of the phantom 117 were also the same as those of the phantom shown in FIG. 3B. The shape of the conductor plate 118 disposed in the example shown in FIG. 6A was a square existing in a plane parallel to the xz-plane, and it had lengths for the x and z-axis directions of 100 mm and 100 mm, respectively. The distance between the phantom 117 and the conductor plate 118 was 20 mm. The conductor loop 116 disposed in the example shown in FIG. 6B was a loop having a square shape, and it had lengths for the x and z-axis directions of 100 mm and 100 mm, respectively, and a line width of the conductor forming the loop of 10 mm. The distance between the phantom 117 and the conductor loop 116 was 20 mm. As for physical properties, electric conductivity was set to be 5.8×10^7 S/m for both the conductor plate 118 and the conductor loop 116, with supposing copper.

Although electric power was supplied at two positions of the birdcage coil 119 in the case of FIG. 3A in order to apply magnetic fluxes to the phantom 117, electric power was supplied only at one position in this case to generate a linear magnetic field B. This is for confirming the effect of the conductor plate 118 and the conductor loop 116 as clearly as possible. Specifically, electric power was supplied so that only the magnetic field By was formed in the y-axis direction. Therefore, the magnetic field shown in the drawing is also the component By for the y-axis direction. The distribution of the magnetic field By shown in FIG. 6A and FIG. 6B is indicated with values obtained by subtracting values of By magnetic field distribution in the case of not disposing the conductor plate 118 or the conductor loop 116 from the values of By magnetic field distribution in the case of disposing the conductor plate 118 or the conductor loop 116, and it indicates change of By magnetic field distribution caused by disposing the conductor plate 118 or the conductor loop 116.

First, according to the result of the simulation for the case of disposing the conductor plate 118 shown in FIG. 6A, as for By in the phantom 117, it can be confirmed that By significantly changed in the neighborhood of the conductor plate 118. As shown in this drawing, in the region of the phantom 117 covered with the conductor plate 118, the value of By becomes negative. This indicates that the By value is made small by disposing the conductor plate 118. On the other hand, in the regions near both ends of the conductor plate 118 shown in FIG. 6A, the By value becomes positive. This indicates that the By value is made large by disposing the conductor plate 118.

Next, according to the result of the simulation for the case of disposing the conductor loop 116 shown in FIG. 6B, it can be seen that substantially the same By magnetic field distribution as that of the case of FIG. 6A is observed. This indicates that an electric current flowed in such a direction that the magnetic fluxes are compensated even with the conductor loop 116. By the aforementioned simulation results, it is demonstrated that uneven magnetic flux densities can be obtained also with the conductor loop 116.

In this simulation, the magnetic flux By in the y-axis direction was considered. However, since the rotating magnetic field $B_1$ is also influenced by By as shown by the equation mentioned above, $B_1$ value also significantly changes with change of By.

From the results shown in FIG. 6A and FIG. 6B, it could be confirmed that distribution of the rotating magnetic field $B_1$ generated by the RF transmission coil 114 could be changed by disposing the conductor plate 118 or the conductor loop 116 near the phantom 117.

Figure 7B:
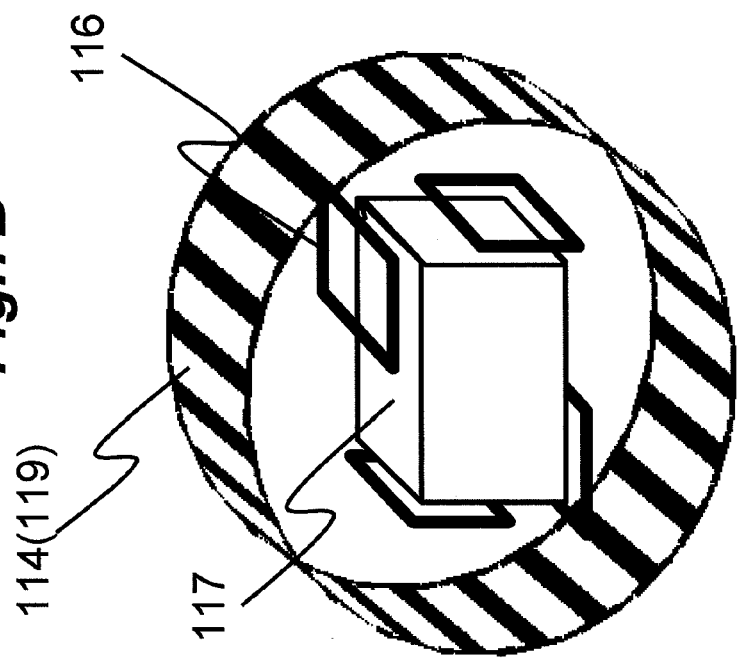
FIG. 7B is an explanatory drawing for explaining an example of disposition of a conductor loop for the same.
Figure 7A:
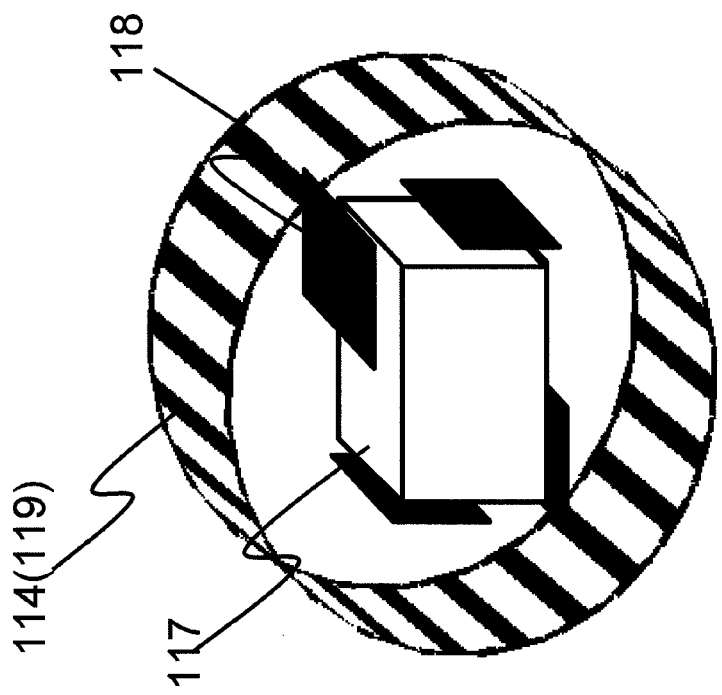
FIG. 7A is an explanatory drawing for explaining an example of disposition of a conductor plate for improving homogeneity of the rotating magnetic field in the phantom.

Next, disposition of the conductor plate 118 or the conductor loop 116 for reducing inhomogeneity in distribution of the rotating magnetic field $B_1$ will be examined. Examples of the disposition are shown in FIG. 7A and FIG. 7B. As shown in FIG. 3B, in the distribution of the rotating magnetic field $B_1$ generated by the birdcage coil 119, two regions showing low intensity are observed at two positions on the upper and lower sides of the phantom 117, and regions showing high intensity are observed at the four corners of the phantom 117. In order to make such distribution homogeneous, the conductor plates 118 are disposed near the four corners of the phantom 117 showing high intensity of the rotating magnetic field $B_1$, so that the ends of the conductor plates 118 locate near the two regions showing low intensity of the rotating magnetic field $B_1$ on the upper and lower sides of the phantom 117, as shown in FIG. 7A. In this example, such a disposition is realized with four of the conductor plates 118 as shown in FIG. 7A. Further, in order to obtain the same effect, as shown in FIG. 7B, four of the conductor loops 116 are disposed at the same positions as those of the conductor plates 118 shown in FIG. 7A.

The effects of dispositions of the conductor plates 118 and the conductor loops 116 shown in FIG. 7A and FIG. 7B for reducing inhomogeneity of the rotating magnetic field $B_1$ in the phantom 117 are demonstrated by simulation, respectively. FIG. 8A to FIG. 8C show the simulation results. FIG. 8A shows distribution of the rotating magnetic field $B_1$ for the case where the conductor plate 118 and the conductor loop 116 are not disposed, FIG. 8B shows the same for the case where the conductor plates 118 are disposed as shown in FIG. 7A, and FIG. 8C shows the same for the case where the conductor loops 116 are disposed as shown in FIG. 7B.

In this simulation, the shape of the phantom 117 was the same rectangular parallelepiped as that of the phantom shown in FIG. 3B, and the sizes for the x, y and z-axis directions were 300 mm, 200 mm, and 300 mm, respectively. Further, physical properties of the phantom 117 were also the same as those of the phantom shown in FIG. 3B. In FIG. 8B, the disposed conductor plates 118 consisted of two of those having a rectangular shape existing in planes parallel to the xz plane, and two of those having a rectangular shape existing in planes parallel to the yz plane, i.e., four conductor plates in total. As for the size of the conductor plates, the former two had a size of 170 mm×150 mm, and the latter two had a size of 120 mm×150 mm. The distance between the phantom 117 and the conductor plates 118 was 20 mm. Further, in the case shown in FIG. 8C, as the conductor loops 116, those having the same size as that of the conductor plates 118 used in the case of FIG. 8B were disposed at the same positions in the same number. The line width of the conductor loop 116 was 10 mm. As for physical properties, electric conductivity was set to be 5.8×10^7 S/m for both the conductor plate 118 and the conductor loop 116, with supposing copper.

In the case shown in FIG. 8A, two regions showing low intensity of the rotating magnetic field $B_1$ were observed on the upper and lower sides of the phantom 117, and regions showing high intensity of the rotating magnetic field $B_1$ were observed at four corners of the phantom 117. In contrast, it can be seen that, in the example shown FIG. 8B, in which the conductor plates 118 were disposed, the differences of the intensities of the rotating magnetic field $B_1$ were reduced, and there was provided more homogeneous distribution of the rotating magnetic field B. Also in the example shown in FIG. 8C, in which the conductor loops 116 were disposed, more homogeneous distribution of the rotating magnetic field $B_1$ was provided compared with the case shown in FIG. 8A.

As an index quantitatively indicating homogeneity of the distribution of the rotating magnetic field $B_1$, a homogeneity index USD represented by the following equation (4) is used.

$$USD = \sigma(B_1)/m(B_1) \tag{4}$$

$m(B_1)$ and $\sigma(B_1)$ represent average of the rotating magnetic field $B_1$, and standard deviation, respectively. As shown by the equation (4), the homogeneity index USD is a value obtained by dividing the standard deviation of the rotating magnetic field $B_1$ with the average thereof. Therefore, as the dispersion of the rotating magnetic field $B_1$ becomes smaller, the value of the homogeneity index USD becomes smaller, and thus a smaller value of the homogeneity index USD indicates higher homogeneity of the rotating magnetic field B.

Values of the homogeneity index USD for the cases shown in FIG. 8A to FIG. 8C calculated from the results of the simulation are 0.391, 0.279, and 0.322, respectively, and thus it can be seen that the homogeneity of the rotating magnetic field $B_1$ becomes higher in the cases shown in FIG. 8B and FIG. 8C, in which the conductor plates 118 or the conductor loops 116 were disposed, compared with the case shown in FIG. 8A, in which the conductor plate 118 or the conductor loop 116 was not disposed.

From these results, it was confirmed that inhomogeneity in distribution of the rotating magnetic field $B_1$ in the phantom 117 could be reduced by using the conductor plate 118 or the conductor loop 116. That is, it was demonstrated that inhomogeneity in distribution of the rotating magnetic field $B_1$ generated by the birdcage coil 119 could be reduced by disposing the conductor loop 116 at an appropriate position between the birdcage coil 119 and the phantom 117.

According to this embodiment, as the conductor loop 116, a conductor loop 310 constituting part of the RF reception coil 115 is used. Namely, according to this embodiment, the conductor loop 310 constituting part of the RF reception coil 115 is made to have three functions, a function of receiving a magnetic resonance signal generated from the subject 103 (signal reception function) and a function of decoupling the RF transmission coil 114 (magnetic decoupling function), which are standard functions of the RF reception coil 115, as well as a function of controlling distribution of the rotating magnetic field $B_1$ (magnetic field control function). The conductor loop 310 having these three functions is henceforth called trifunctional conductor loop 320.

The RF reception coil 115 according to this embodiment that realizes the above, and the details of the trifunctional conductor loop 320 will be explained.

Exemplary configuration and disposition of the RF reception coil 115 according to this embodiment are shown in FIG. 9. Into the bore of the RF transmission coil 114, the subject 103 laid on the table 107 as the object of the imaging is inserted. The subject 103 is schematically shown by only a cut-out region to be imaged. The RF reception coil 115 having trifunctional conductor loop 320 is disposed between the RF transmission coil 114 and the subject 103.

In FIG. 9, there is shown an example in which the RF reception coil 115 is constituted with 16 trifunctional conductor loops 320. The number of the trifunctional conductor loops 320 constituting the RF reception coil 115 is not limited to the number mentioned above. It is sufficient that the RF reception coil 115 is constituted with a plurality of the conductor loops.

According to this embodiment, at the time of RF transmission, a part of the plurality of the trifunctional conductor loops 320 are made to function as a magnetic field control circuit that realizes the magnetic field control function to shield or enhance the rotating magnetic field $B_1$ and make distribution of the rotating magnetic field $B_1$ homogeneous as shown in FIG. 7A to FIG. 8C.

Next, circuit configuration of the trifunctional conductor loop 320 will be explained. Prior to the explanation, circuit configuration of a general conductor loop 210 of a conventional RF reception coil 115 will be explained. This conductor loop 210 realizes the reception function and the magnetic decoupling function. The reception function is realized at the time of reception of a magnetic resonance signal, and the magnetic decoupling function is realized at the time of irradiation of a radio frequency magnetic field. FIG. 10 shows an exemplary circuit of the conductor loop 210.

As shown in this drawing, the conductor loop 210 has a resonance circuit 211 in which a capacitor 240 and a capacitor 242 are disposed, and a circuit having a diode 243 and an inductor 241 connected in series. To the capacitor 240, the circuit having a diode 243 and an inductor 241 connected in series is connected in parallel to constitute a magnetic decoupling circuit 247. To the two ends of the diode 243, an electrical connection control device 160 is connected. Further, to the two ends of the capacitor 242, a preamplifier 245 for amplifying a weak signal from the subject 103 and receiving it at the time of reception of a magnetic resonance signal is connected. The preamplifier 245 is connected to the receiver 108. In this case, the inductance of the conductor loop 210 itself is not considered. Further, although one capacitor 240 is shown in the drawing, the number of capacitors 240 is not limited to this number.

In order to realize the reception function, the conductor loop 210 is constituted so that it resonates at the frequency of the magnetic resonance signal at the time of reception of the magnetic resonance signal. In this example, the value of the capacitor 240 is adjusted so that the resonance frequency of the resonance circuit 211 corresponds to the frequency of the magnetic resonance signal as the object of reception. In this adjustment, the value of the capacitor 240 is adjusted according to the value of the inductance produced by the structure of the conductor loop 210 (resonance circuit 211). With such adjustment, the conductor loop 210 can receive a magnetic resonance signal generated from the subject 103 at a higher sensitivity at the time of detecting the magnetic resonance signal.

In order to realize the magnetic decoupling function, the magnetic decoupling circuit 247 serves as a resonance circuit constituted by the inductor 241 and the capacitor 240, and is adjusted so that the resonance frequency thereof corresponds to the frequency of the RF signal to be transmitted. This adjustment is attained by changing the value of the inductor 241. With such adjustment, if a control signal is transmitted from the electrical connection control device 160 to make the diode 243 to be in the ON state and thereby allow an electric current to flow, the resonance circuit has high impedance at the time of the irradiation of a radio frequency magnetic field, and thus electric current no longer flows in the whole conductor loop 210. Therefore, by transmitting a control signal from the electrical connection control device 160 at the time of irradiation of a radio frequency magnetic field, the magnetic field can be made not to be affected.

Next, circuit configuration of the trifunctional conductor loop 320 according to this embodiment will be explained. As described above, the trifunctional conductor loop 320 according to this embodiment realizes the above-mentioned magnetic field control function, i.e., the function of shielding or enhancing a magnetic field, as the third function, in addition to the reception function and the magnetic decoupling function, which are functions of the conventional conductor loop 210. The magnetic field control function is realized at the time of the irradiation of a radio frequency magnetic field.

An exemplary circuit configuration of the trifunctional conductor loop 320 according to this embodiment that can realize these three functions is shown in FIG. 11. As shown in this drawing, the trifunctional conductor loop 320 has fundamentally the same configuration as that of the conductor loop 210 shown in FIG. 10. That is, it is provided with a circuit having a diode 143 and an inductor 141 connected in series and a resonance circuit 321 formed by connecting a capacitor 140 and a capacitor 142. The inductance of the conductor loop 210 itself is not considered also in the circuit shown in FIG. 11, as in the case of the circuit shown in FIG. 10. To the capacitor 140, the circuit having a diode 143 and an inductor 141 connected in series is connected in parallel to constitute the magnetic decoupling circuit 147. Further, to the two ends of the capacitor 142, the preamplifier 145 for amplifying a weak signal from the subject 103 and receiving it at the time of reception of a magnetic resonance signal is connected. The preamplifier 145 is connected to the receiver 108. Further, the electrical connection control device 160 is connected to the two ends of the diode 143. ON/OFF control of the diode 143 is performed with a control signal sent from the electrical connection control device 160.

Further, the value of the capacitor 140 and the value of the inductor 141 are adjusted so that the resonance frequency of the trifunctional conductor loop 320 (resonance circuit 321) corresponds to the frequency of the magnetic resonance signal to be received, and the resonance frequency of the magnetic decoupling circuit 147 corresponds to the frequency of the radio frequency magnetic field to be irradiated, as in the case of the conductor loop 210.

In the trifunctional conductor loop 320, a diode 144 is further connected to the capacitor 140 in parallel. Further, a diode 146 is also connected to the capacitor 142 in parallel. The ends of these diodes 144 and 146 are also connected to the electrical connection control device 160, respectively, and the ON/OFF control is carried out with a control signal sent from the electrical connection control device 160.

In addition, each of the diodes 143, 144 and 146 serves as a switch circuit that controls electrical connection. Henceforth, the diode 143 is called first switch circuit, and the diode 144 and the diode 146 are called second switch circuit, respectively.

Also in the case shown in this drawing, the inductance of the trifunctional conductor loop 320 itself is not considered. Further, although one capacitor 140 is shown in the drawing, the number of capacitors 140 is not limited to this number. Furthermore, according to this embodiment, the diode 144 is connected to every capacitor 140 in parallel.

Next, it will be explained that the trifunctional conductor loop 320 having the above circuit configuration can realize the reception function, the magnetic decoupling function, and the magnetic field control function. FIG. 12A to FIG. 12C show flows of electric currents flowing in the circuit of the trifunctional conductor loop 320, in which FIG. 12A is a drawing for the case of realizing the reception function, FIG. 12B is a drawing for the case of realizing the magnetic decoupling function, and FIG. 12C is a drawing for the case of realizing the magnetic field control function.

As shown in FIG. 12A, when the reception function is realized, the diode 143 constituting the first switch circuit, and all the diodes 144 and 146 constituting the second switch circuit are made to be in the OFF state. Thereby, if a magnetic resonance signal emitted from the subject 103 enters, an electric current flows in the path passing the capacitor 140 and the capacitor 142 (resonance circuit 321) in the trifunctional conductor loop 320, as indicated with an arrow 601 in FIG. 12A. Since the resonance circuit 321 is a resonance circuit of which resonance frequency is the frequency of the magnetic resonance signal, it can receive the magnetic resonance signal.

As shown in FIG. 12B, when the magnetic decoupling function is realized, the diode 143 constituting the first switch circuit is made to be in the ON state, and all the diodes 144 and 146 constituting the second switch circuit are made to be in the OFF state. Thereby, even if a radio frequency magnetic field is irradiated, and enters into the trifunctional conductor loop 320, the magnetic decoupling circuit 147 has high impedance, and therefore electric current does not flow in the resonance circuit 321. That is, magnetic coupling with the RF transmission coil 114 can be prevented.

As shown in FIG. 12C, when the magnetic field control function is realized, the diode 143 constituting the first switch circuit, and all the diodes 144 and 146 constituting the second switch circuit are made to be in the ON state. Thereby, if a radio frequency magnetic field irradiated by the RF transmission coil 114 enters, an electric current flows in the path passing the diodes 144 and 146 in the trifunctional conductor loop 320, as indicated with an arrow 602 in FIG. 12C. Since the resonance frequency of the loop constituted by this path is different from the frequency of the magnetic resonance signal (RF signal), it does not resonate, but an electric current flows in such a direction that the magnetic field is compensated, and it provides the same function as that of the aforementioned conductor loop 116. That is, the center part of the trifunctional conductor loop 320 shields the magnetic field, and the end parts of the trifunctional conductor loop 320 enhance the magnetic field.

As explained above, by using the circuit configuration shown in FIG. 11 and controlling ON/OFF states of the diodes 143, 144 and 146 with the electrical connection control device 160, the aforementioned three functions can be realized with the trifunctional conductor loop 320.

Figure 13:
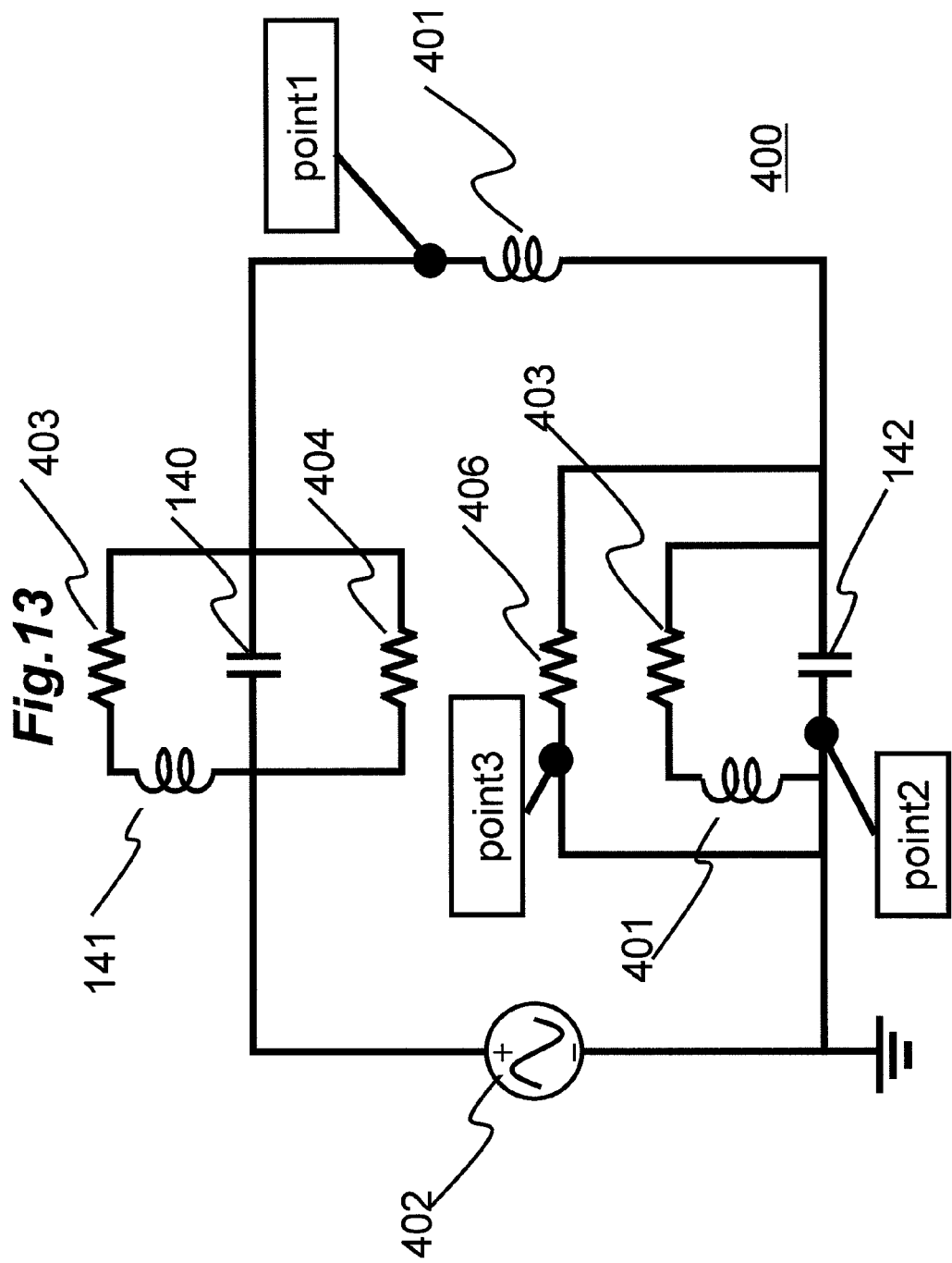
FIG. 13 is a circuit diagram of an equivalent circuit for simulating flow of electric current in a conductor loop according to the first embodiment.

The results of simulation performed by an electronic circuit simulator for confirming that the aforementioned three functions can be realized with the circuit configuration shown in FIG. 11 will be shown below. FIG. 13 is a circuit diagram of an equivalent circuit 400 of a circuit used for the simulation.

Although the configuration of the circuit used for the simulation was based on that shown in FIG. 11, a serial circuit having the diode 143 and the inductor 141 connected in series was connected to the both of the capacitor 140 and the capacitor 142 in parallel. Further, the inductance of the trifunctional conductor loop 320 itself was reproduced by disposing an inductor 401 as shown on the right side of the circuit diagram. Further, in this simulation, a power supply part 402 was inserted into the circuit (equivalent circuit 400) as shown on the left side of the circuit diagram, since it was intended to examine flow of electric current at the time of realizing each function.

As for the values of the capacitors 140 and 142, and the inductors 141 and 401 in the circuit (equivalent circuit 400), the value of the inductor 401 was 240 nH, the values of the both capacitors 140 and 142 are 13 pF, and the value of the inductor 141 was 120 nH. The value of the inductor 401 was determined with reference to the value of inductance of a 100-mm square loop, and it was close to the inductance of one loop of the RF reception coil 115 in terms of order. The values of capacitors 140 and 142 were determined according to the value of the inductor 401 so that the resonance frequency of the resonance circuit 321 of the trifunctional conductor loop 320 became 128 MHz. 128 MHz is the frequency of RF used in a 3T MRI apparatus. The value of the inductor 141 was determined so that the inductor 141 and the capacitor 140 or 142 connected in parallel constituted a resonance circuit.

The resistances 403, 404, and 406 shown in the drawing are disposed for simulating ON/OFF of the diodes 143, 144, and 146. The simulation was performed by substituting 1Ω for the resistance value as the ON state of the diode, or substituting 1 kΩ for the resistance value as the OFF state of the diode.

Figure 14C:
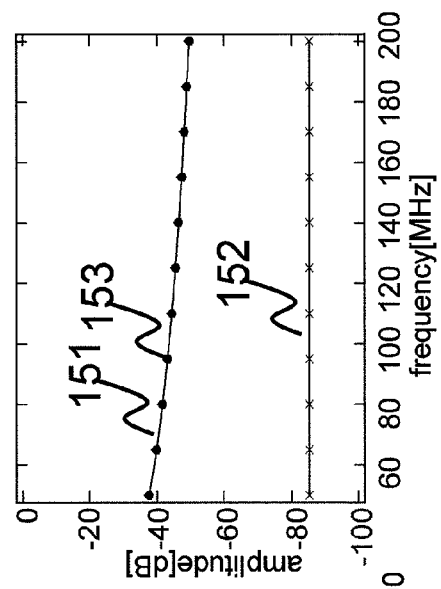
FIG. 14C is a graph showing electric current values at the points in the equivalent circuit shown in FIG. 13 at the time of simulating the case where the magnetic field control function is realized.
Figure 14B:
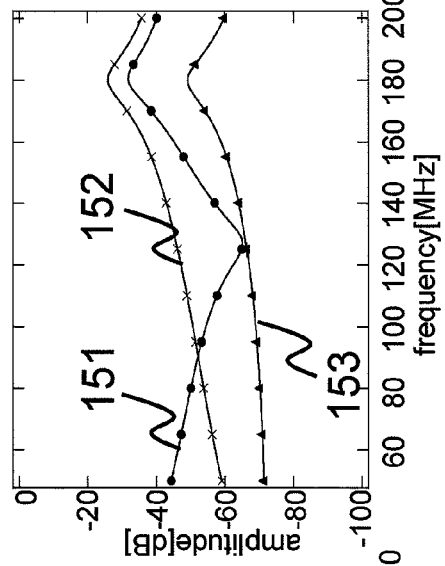
FIG. 14B is a graph showing electric current values at the points in the equivalent circuit shown in FIG. 13 at the time of simulating the case where the magnetic decoupling function is realized.
Figure 14A:
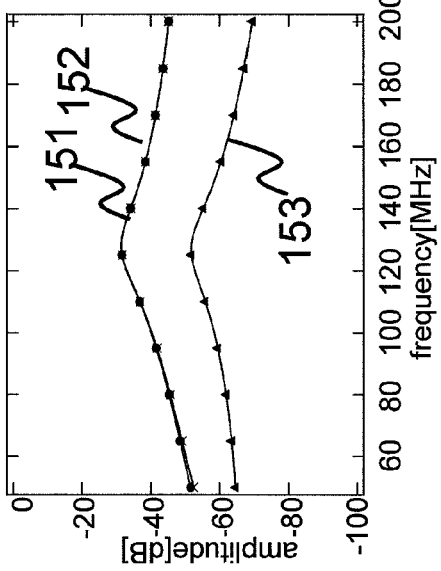
FIG. 14A is a graph showing electric current values at the points in the equivalent circuit shown in FIG. 13 at the time of simulating the case where the reception function is realized.

In this simulation, attention was paid to electric current values at the three points (points 1, 2, and 3) in the equivalent circuit 400 shown in FIG. 13. The results of the simulation of the values of electric current flowing in the equivalent circuit 400 are shown in FIG. 14A to FIG. 14C. Each graph shows the frequency response of the electric current value represented in the unit of dB. FIG. 14A shows the electric current values at the time of simulating the reception function, FIG. 14B shows the electric current values at the time of simulating the magnetic decoupling function, and FIG. 14C shows the electric current values at the time of simulating the magnetic field control function.

That is, FIG. 14A shows the results obtained with the values of 1 kΩ as the value of the resistance 403 simulating the diode 143, and the values of the resistances 404 and 406 simulating the diodes 144 and 146, respectively, FIG. 14B shows the results obtained with the value of 1Ω as the value of the resistance 403 simulating the diode 143, and the values of 1 kΩ as the values of the resistances 404 and 406 simulating the diodes 144 and 146, respectively, and FIG. 14C shows the results obtained with the values of 1Ω as the value of the resistance 403 simulating the diode 143, and the values of the resistances 404 and 406 simulating the diodes 144 and 146, respectively.

In each graph, the line 151 connecting the symbols ● indicates the electric current values at the point 1 in the circuit 400 shown in FIG. 13, the line 152 connecting the symbols x indicates the electric current values at the point 2, and the line 153 connecting the symbols ▲ indicates the electric current values at the point 3.

In the case shown in FIG. 14A where the resistance values were set as described above, electric currents of the same amplitudes flowed at the points 1 and 2, and electric current hardly flowed at the point 3. This indicates that an electric current flowed in the trifunctional conductor loop 320 as shown in FIG. 12A.

In the case shown in FIG. 14B where the resistance values were set as described above, focusing on the values corresponding to the frequency of 128 MHz, a weak electric current flew at the point 2, but electric current hardly flowed at the point 1 and 3. No flowing of electric current at the point 1 indicates that electric current hardly flowed in the trifunctional conductor loop 320. Further, flowing of electric current only at the point 2 indicates that the inductor 141 and the capacitor 142 connected in parallel constituted a resonance circuit, and had a high impedance.

In the case shown in FIG. 14C where the resistance values were set as described above, electric currents of the same amplitudes flowed at the points 1 and 3, and electric current hardly flowed at the point 2. This indicates that an electric current flowed in a path not passing the capacitors 140 and 142 in the trifunctional conductor loop 320 as shown in FIG. 12C.

On the basis of the results of the simulation described above, it was confirmed that all of the three functions, the reception function, the magnetic decoupling function, and the magnetic field control function, could be realized with the same loop by using the circuit shown in FIG. 11.

Therefore, in the RF reception coil 115 constituted with a plurality of trifunctional conductor loops 320, by preliminarily determining trifunctional conductor loops 320 that realize the magnetic field control function at the time of irradiation of a radio frequency magnetic field, transmitting a control signal to these trifunctional conductor loops 320 so that they realize the magnetic field control function, and transmitting a control signal to the remaining trifunctional conductor loops 320 so that they realize the magnetic decoupling function at the time of irradiation of a radio frequency magnetic field, and transmitting a control signal to all the trifunctional conductor loops 320 so that they realize the reception function at the time of receiving a magnetic resonance signal, the magnetic resonance signal can be received without generating magnetic coupling and with correcting inhomogeneity of the rotating magnetic field $B_1$.

The electrical connection control device 160 according to this embodiment transmits a control signal to the second switch circuits (diodes 144 and 146) of the trifunctional conductor loops 320 preliminarily determined to realize the magnetic field control function, and transmits a control signal to the first switch circuits (diode 143) of the remainder trifunctional conductor loops 320 at the time of irradiation of a radio frequency wave according to directions sent from the sequencer 104 as described above. The sequencer 104 performs this control according to directions sent from the computer 109.

As explained above, the trifunctional conductor loop 320 according to this embodiment functions as a conductor loop that shields or enhances a magnetic with a control signal transmitted from the electrical connection control device 160. Therefore, in the RF reception coil 115 provided with a plurality of the trifunctional conductor loops 320, if the trifunctional conductor loops 320 at predetermined positions, such as the positions shown in FIG. 7B and FIG. 8C, are controlled so that they realize the magnetic field control function at the time of irradiation of a radio frequency magnetic field, inhomogeneity of the rotating magnetic field $B_1$ generated by the RF transmission coil 114 can be reduced.

As explained with reference to FIG. 4A to FIG. 8C, by disposing the conductor loop 116 between the subject 103 and the RF transmission coil 114, inhomogeneity of the rotating magnetic field $B_1$ can be reduced. For reducing inhomogeneity of the rotating magnetic field $B_1$ with this conductor loop 116, it is not necessary to control the RF pulse, and any restriction is not imposed on the pulse sequence. Further, since a plurality of waveform generating devices and RF amplifiers for independently driving the RF transmission coil 114 are also unnecessary, the cost can be reduced. Furthermore, this conductor loop 116 theoretically exhibits the effect without contacting with the subject 103, and therefore it is unnecessary to directly put such a member as a dielectric pad having a weight of several kilograms on a patient.

Further, according to this embodiment, the conductor loop 116 that exhibits such an effect as described above is also used as the conductor loop 310 in the RF reception coil 115. Therefore, according to this embodiment, inhomogeneity of the rotating magnetic field $B_1$ can be reduced by using usual geometric structure of the RF reception coil 115 without degrading the effect of the aforementioned conductor loop 116. Accordingly, in addition to the aforementioned effect, there are provided advantages that patients can enjoy the conventional wearing feeling, and MRI technicians are not burdened by increase of time and effort required for setting of the RF reception coil at all.

Therefore, according to this embodiment, images of high quality can be obtained at a low cost without any restriction on the pulse sequence and without any special burden to patients and technicians.

This embodiment is explained with reference to a torso coil to be disposed around the abdominal part as an example of the RF reception coil 115 as shown in FIG. 2, but the RF reception coil 115 to which this embodiment can be applied is not limited to such an example. For example, the coil may be a head coil for imaging of head, a CTL coil for imaging of spinal cord, a coil for breast, or the like.

The results of electromagnetic field analysis simulation performed for the relation between the size of the conductor loop 116 and the magnetic field shielding or enhancing effect will be shown below. The results of simulation for change of the magnetic field distribution in a phantom at the time of changing the size of the conductor loop 116 are shown in FIG. 15A to FIG. 15D.

In this simulation, all the conductor loops 116 had a square shape, and the length of one side was 50 mm in the case shown in FIG. 15A, 100 mm in the case shown in FIG. 15B, 150 mm in the case shown in FIG. 15C, and 200 mm in the case shown in FIG. 15D. The line width of the conductor loop 116 was 10 mm in all the cases. The shape, size, and physical properties of the phantom 117 used were the same as those used in the example shown in FIG. 6B.

As shown in FIG. 15A to FIG. 15D, it can be seen that, as the size of the conductor loop 116 becomes larger, the region in which the magnetic field is shielded becomes larger. Further, it can also be seen that as the size of the conductor loop 116 becomes larger, the effect of enhancing the magnetic field at the ends of the conductor loop 116 becomes more significant.

Each of the above-mentioned coils exemplified as the RF reception coil 115 may have various shapes, and the conductor loop 310 constituting each coil may have various sizes. However, it is thought that the size of the conductor loop constituting the coil is within the range of about 50 to 200 mm. Therefore, if the results shown in FIG. 15A to FIG. 15D are taken into consideration, in the RF reception coil 115 consisting of any type of coil among those exemplified in this specification, each loop in the RF reception coil 115 can be operated as the trifunctional conductor loop 320 according to this embodiment.

In addition, the relation between the size of the trifunctional conductor loop 320 and the magnetic field shielding or enhancing effect depends on the frequency of the radio frequency magnetic field transmitted from the RF transmission coil 114. That is, when the size of the trifunctional conductor loop 320 is sufficiently large compared with the wavelength of the radio frequency magnetic field to be received, the radio frequency magnetic field shielding effect is reduced in the neighborhood of the trifunctional conductor loop 320. This is because if the size of the trifunctional conductor loop 320 is sufficiently large compared with the wavelength of the radio frequency magnetic field to be received, the radio frequency magnetic field passing through the loop may occur. Therefore, when the wavelength of the radio frequency magnetic field becomes shorter, i.e., when the frequency of the radio frequency magnetic field becomes higher, it is effective to correspondingly make the size of the trifunctional conductor loop 320 smaller according to the wavelength of the radio frequency magnetic field, or devise disposition of the trifunctional conductor loop 320 taking the influence of penetration of the radio frequency magnetic field into consideration.

Further, in the aforementioned embodiment, a diode is used as a switch circuit for performing ON/OFF control with a signal from the electrical connection control device 160. However, the switch circuit is not limited to such a means. For example, it may be a switch enabling manual ON/OFF switching. In such a case, when the RF reception coil 115 provided with the trifunctional conductor loop 320 is set with respect to the subject 103, an MRI technician turns on or off the switch of each trifunctional conductor loop 320 as required. Further, it is also possible to use a switch enabling electric ON/OFF switching, such as MEMS (micro-electro-mechanical system).

Further, variable resistors may be used instead of the diodes 143, 144 and 146. In such a case, resistance values thereof are changed according to a control signal sent from the electrical connection control device 160 so that the resistors function in the same manner as the aforementioned diodes 143, 144 and 146. That is, the resistances of the variable resistors used instead of the diodes 143, 144 and 146 are set to be large (for example, 1 kΩ), and then changed to be small (for example, 1Ω) at the time of turning on.

<<Second Embodiment>>

Next, the second embodiment of the present invention will be explained. According to the first embodiment, a respective diode 144 is connected in parallel to each of the capacitors 140 of the trifunctional conductor loops 320 constituting the RF reception coil 115. According to this embodiment, the diode 144 is connected in parallel to only a part of the capacitors 140. The configurations of the MRI apparatus 100 according to this embodiment are fundamentally the same as those used in the first embodiment. This embodiment will be explained below mainly for configurations different from those of the first embodiment.

Exemplary circuit configurations of the trifunctional conductor loops 330 and 340 according to this embodiment are shown in FIG. 16A and FIG. 16B, respectively. In this embodiment, examples having three capacitors 140a, 140b and 140c as the capacitor 140 are exemplified. Also in this embodiment, the number of the capacitors 140 is not limited to this number. These capacitors 140 are included in the resonance circuit 331 or 341 together with the capacitor 142. The values of the capacitors 140 and 142 are adjusted so that, when all the diodes are in the OFF state, the resonance frequency of the resonance circuit 331 or 341 corresponds to the frequency of the magnetic resonance signal to be received.

In the example of the trifunctional conductor loop 330 shown in FIG. 16A, the magnetic decoupling circuit 147 and the diode 144 are connected to the capacitor 140a in parallel, as in the first embodiment. Further, the diode 144 is connected to the capacitor 140b in parallel. On the other hand, the diode 144 is not connected to the capacitor 140c. In addition, the diode 146 and the preamplifier 145 are connected to the capacitor 142 in parallel, as in the first embodiment. Further, the electrical connection control device 160 (not shown in FIGS. 16A and 16B) is connected to each of the diodes 143, 144 and 146, and the ON/OFF control is thereby attained. As in the first embodiment, the diode 143 constitutes the first switch circuit, and the diodes 144 and 146 constitute the second switch circuits.

In the example of the trifunctional conductor loop 340 shown in FIG. 16B, a respective diode 144 is connected to the capacitor 140b and the capacitor 140c in parallel. On the other hand, only the magnetic decoupling circuit 147 is connected to the capacitor 140a in parallel. As for the capacitor 142, the same configuration as that of the example of [shown in] FIG. 16A is used. Further, as in the example shown in FIG. 16A, the electrical connection control device 160 is connected to each of the diodes 143, 144 and 146, and ON/OFF control is thereby performed. That is, the diode 143 constitutes the first switch circuit, and the diodes 144 and 146 each constitute the second switch circuits.

In both the examples shown in FIG. 16A and FIG. 16B, as in the first embodiment, when the first switch circuit is made to be in the ON state, and all of the second switch circuits are made to be in the ON state, if a radio frequency magnetic field irradiated by the RF transmission coil 114 enters, an electric current flows in the path passing the diodes 144 and 146 in the trifunctional conductor loop 330 or 340. The resonance frequency of the loop constituted by this path is different from the resonance frequency of the resonance circuit 331 or 341, because of the difference in the configuration. Therefore, it is different from the frequency of the magnetic resonance signal (RF signal), and the loop functions in the same manner as that of the trifunctional conductor loop 320 of the first embodiment.

The results of simulation for change of the magnetic field distribution in the phantom 117 performed by using a trifunctional conductor loop 390 provided with four of the capacitors 140 with changing the number of the capacitors 140 to which the diode 144 is connected in parallel are shown in FIG. 17A to FIG. 17E.

FIG. 17A shows the result for the case where diodes 144 were connected to all the capacitors 140 in parallel, FIG. 17B shows the result for the case where diodes 144 were connected to three of the capacitors 140 in parallel, FIG. 17C shows the result for the case where diodes 144 were connected to two of the capacitors 140 in parallel, FIG. 17D shows the result for the case where a diode 144 was connected to one of the capacitors 140 in parallel, and FIG. 17E shows the result for the case where no diode 144 was connected to any of the capacitors 140.

The trifunctional conductor loop 390 used had a square shape having a length of each side of 100 mm. Further, the line width of the trifunctional conductor loop 390 was 10 mm for all the cases.

As shown in FIG. 17A, when diodes 144 were connected to all the capacitors 140, the result was the same as that shown in FIG. 15B. That is, the trifunctional conductor loop 390 shielded the magnetic field in the neighborhood of the trifunctional conductor loop 390, and the magnetic field was enhanced around the ends of the trifunctional conductor loop 390. As shown in FIG. 17B, also when diodes 144 were connected to three of the capacitors 140 in parallel, almost the same tendency as that observed in the result shown in FIG. 17A was observed.

Further, as shown in FIG. 17C to FIG. 17E, as the number of the diodes 144 decreased, the magnetic field distribution changed differently. That is, as the number of the diodes 144 decreased, the magnetic field was enhanced in the neighborhood of the center of the trifunctional conductor loop 390 and the neighborhood of the ends of the trifunctional conductor loop 390, and the magnetic field was shielded in a region near the conductive wire of the trifunctional conductor loop 390. This was because, as the number of the diodes 144 decreased, the value of the capacitors 140 in the trifunctional conductor loop 390 became smaller. Thus, the frequency became closer to the resonance frequency, and flow of electric current in the trifunctional conductor loop 390 changed.

By this simulation, it was demonstrated that, even if the number of the diodes 144 was reduced to three, the same effect as that of the first embodiment could be obtained in this example.

As explained above, according to this embodiment, inhomogeneity of the rotating magnetic field $B_1$ generated by the RF transmission coil 114 can be reduced with the RF reception coil 115, as in the first embodiment. Therefore, like the first embodiment, images of high quality can be obtained at a low cost without any restriction on the pulse sequence and without any special burden to patients and technicians.

In conductor loops constituting the RF reception coil 115 actually used, about 2 to 6 of the capacitors 140 are disposed in many cases. Therefore, according to this embodiment, the number of the diodes can be further reduced compared with the first embodiment, in which diodes are connected to all the capacitors 140. Thereby, the wiring for supplying electric current to the diodes can be correspondingly reduced, and the operability can also be improved. Therefore, images of high quality can be easily obtained at a further lower cost.

It is desirable that a diode 144 is certainly connected in parallel to the capacitor 142 between reception ports to which the preamplifier 145 is connected. This is because the electric current flowing when the magnetic field is shielded may exceed the tolerance limit of the preamplifier 145, and such an electric current should be prevented from directly flowing in the preamplifier 145. However, if it is difficult to dispose the diode 144 in this part because of the structure of the RF reception coil 115, the circuit may be devised to protect the preamplifier 145, and thereby a configuration not disposing the diode 144 may also be used.

Further, also in this embodiment, another configuration may be used to substitute for the switch circuit, like the first embodiment. Further, this embodiment can also be applied to a variety of RF reception coils 115, like the first embodiment.

<<Third Embodiment>>

Next, the third embodiment of the present invention will be explained. According to the aforementioned embodiments, all of the plurality of the conductor loops 310 constituting the RF reception coil 115 are the trifunctional conductor loops 320, and they are used with switching according to control signals sent from the electrical connection control device 160 as required. In this embodiment, however, the RF reception coil is constituted by conductor loops having the reception function and the magnetic decoupling function, and conductor loops having the reception function and the magnetic field control function.

The configurations of the MRI apparatus 100 according to this embodiment are fundamentally the same as those used in the first embodiment. However, it is provided with an RF reception coil 115a according to this embodiment instead of the RF reception coil 115. This embodiment will be explained below mainly for configurations different from those of the first embodiment.

Figure 18:
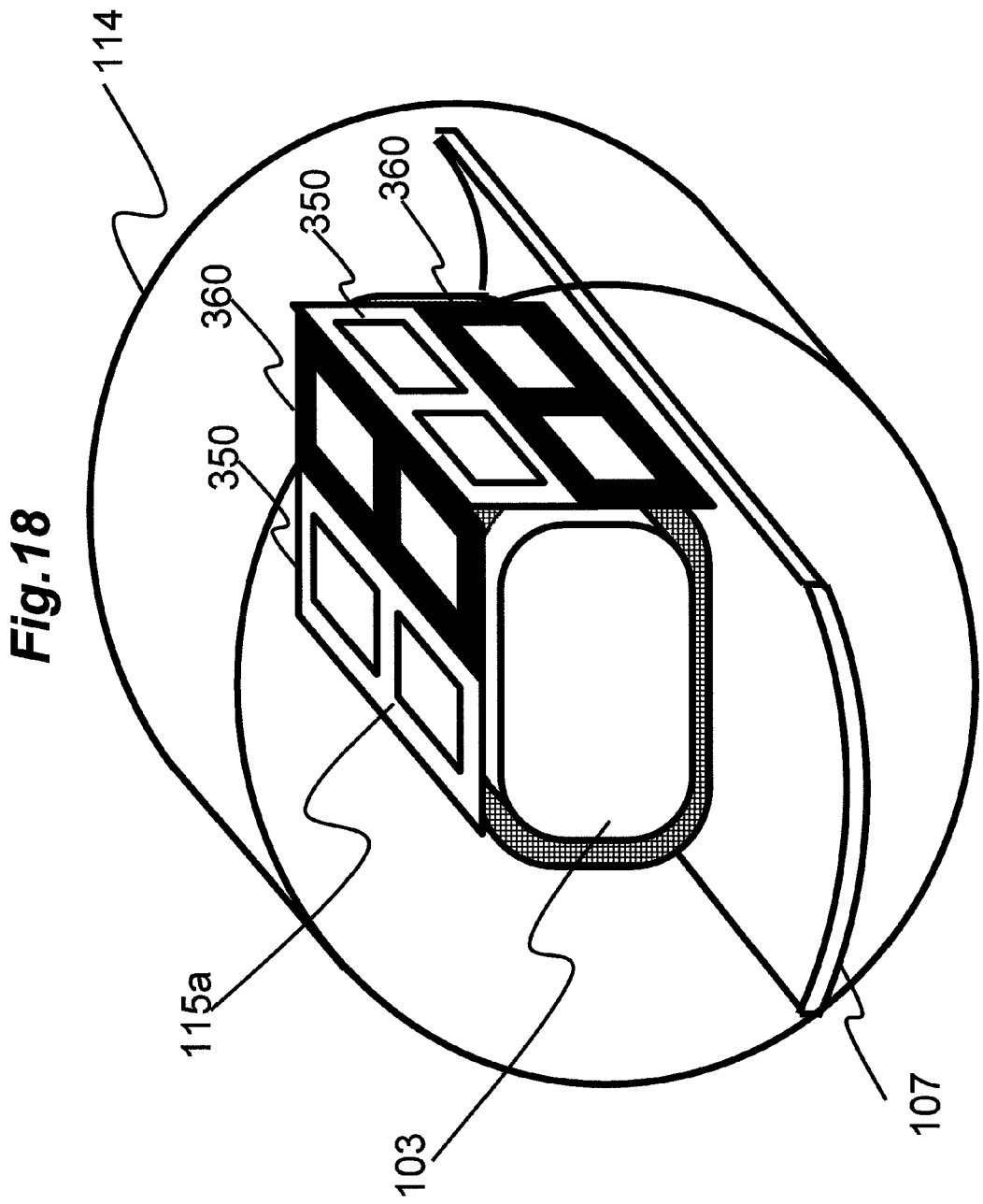
FIG. 18 is an explanatory drawing for explaining exemplary configuration and disposition of an RF reception coil according to the third embodiment.

Exemplary configuration and disposition of the RF reception coil 115a according to this embodiment are shown in FIG. 18. Also in this embodiment, the subject 103 laid on the table 107 as an object of imaging is inserted into the bore of the RF transmission coil 114 as in the first embodiment. The subject 103 is schematically shown by only a cut-out region to be imaged. Conductor loops constituting the RF reception coil 115a are disposed between the RF transmission coil 114 and the subject 103.

As shown in this drawing, the RF reception coil 115a according to this embodiment is provided with first bifunctional conductor loops 350 that realize the reception function and the magnetic decoupling function, and second bifunctional conductor loops 360 that realize the reception function and the magnetic field control function.

In this explanation, for example, it is supposed that the RF reception coil 115a according to this embodiment receives a magnetic resonance signal within distribution of the rotating magnetic field $B_1$ shown in FIG. 3A, and in order to reduce inhomogeneity of this distribution of the rotating magnetic field $B_1$, the second bifunctional conductor loops 360 are disposed at the positions shown in FIG. 7B.

Since the circuit configuration of the first bifunctional conductor loop 350 is the same as that of the conductor loop 210 shown in FIG. 10, it is not explained here. Also in this embodiment, a control signal is transmitted to the diode 243 from the electrical connection control device 160.

A circuit configuration of the second bifunctional conductor loop 360 is shown in FIG. 19A. As shown in this drawing, the second bifunctional conductor loop 360 is provided with a resonance circuit 361 in which the capacitor 140 and the capacitor 142 are disposed, the diode 144 is connected to the capacitor 140 in parallel, and the diode 146 is connected to the capacitor 142 in parallel. The electrical connection control device 160 (not shown in the drawing) is connected to each of the diodes 144 and 146, and ON/OFF control thereof is carried out with it. That is, each of the diodes 144 and 146 constitutes a second switch circuit. Further, the preamplifier 145 is connected to the capacitor 142 in parallel.

The values of the capacitor 140 and the capacitor 142 are adjusted so that the resonance frequency of the resonance circuit 361 corresponds to the frequency of the magnetic resonance signal to be received.

Since the second bifunctional conductor loop 360 according to this embodiment has the aforementioned circuit configuration, it usually resonates at the frequency of the magnetic resonance signal, and receives the magnetic resonance signal. However, when the second switch circuits are turned on by the electrical connection control device 160, it does not resonate with the magnetic resonance signal, but functions as the aforementioned conductor loop 116 to shield or enhance the rotating magnetic field $B_1$ generated by the RF transmission coil 114.

Also in this embodiment, the number of the capacitors 140 is not limited. Further, a diode 144 need not be connected in parallel to every one of the capacitors 140.

As explained above, the RF reception coil according to this embodiment can receive a magnetic resonance signal, and upon transmission of a radio frequency magnetic field, it can prevent magnetic coupling and effectively reduce inhomogeneity of the rotating magnetic field $B_1$, like the RF reception coil according to the first embodiment. Therefore, the same effect as that of the first embodiment can be obtained.

Further, the first bifunctional conductor loop 350 is not provided with the diodes 144 and 146 constituting the second switch circuits for realizing the magnetic field control function. And the second bifunctional conductor loop 360 is not provided with the diode 143 constituting the first switch circuit for magnetic decoupling. Therefore, in each conductor loop, wiring for flowing electric currents for controlling these diodes are unnecessary. Therefore, the same effect as that of the first embodiment can be realized with a simpler configuration.

Since the function of each conductor loop constituting the RF reception coil at the time of transmission of a radio frequency magnetic field is defined beforehand, it is not necessary to control which function should be realized for every conductor loop. Therefore, when distribution of the rotating magnetic field $B_1$ is known beforehand, and a part in which the magnetic field is desired to be shielded or enhanced at the time of transmission of a radio frequency magnetic field can be specified, inhomogeneity of the rotating magnetic field $B_1$ can be reduced in a simpler manner by using the RF reception coil according to this embodiment.

In addition, the circuit configuration of the second bifunctional conductor loop 360 according to this embodiment is not limited to that shown in FIG. 19A. Another example (second bifunctional conductor loop 360a) is shown in FIG. 19B.

As shown in this drawing, the second bifunctional conductor loop 360a is provided with a resonance circuit 361a in which the capacitor 140 and the capacitor 142 are disposed. A cross diode pair 148 is connected to the capacitor 140 in parallel, and a cross diode pair 149 is connected to the capacitor 142 in parallel. Further, the preamplifier 145 is connected to the capacitor 142 in parallel.

By using the cross diode pairs 148 and 149 instead of the diodes 144 and 146 for control of the switching, electric currents for controlling the diodes become unnecessary. Therefore, wiring from the electrical connection control device 160 becomes unnecessary, and the aforementioned effect can be realized with a further simpler configuration.

Also in the second bifunctional conductor loop 360a, the values of the capacitor 140 and the capacitor 142 are adjusted so that the resonance frequency of the resonance circuit 361a corresponds to the frequency of the magnetic resonance signal to be received.

<<Fourth Embodiment>>

Hereafter, the fourth embodiment of the present invention will be explained. The MRI apparatus according to this embodiment has a function of determining for which function, the magnetic decoupling function or the magnetic field control function, the trifunctional conductor loop 320, 330, or 340 (henceforth represented by the trifunctional conductor loop 320) is used at the time of irradiation of a radio frequency magnetic field in the RF reception coil 115 according to the first or second embodiment.

The functions of the MRI apparatus according to this embodiment are basically the same as those of the first embodiment. Further, the circuit configuration of the RF reception coil 115 according to this embodiment is also basically the same as that of the aforementioned first or second embodiment. This embodiment will be explained below mainly for configurations different from those of the first or second embodiment.

Figure 20B:
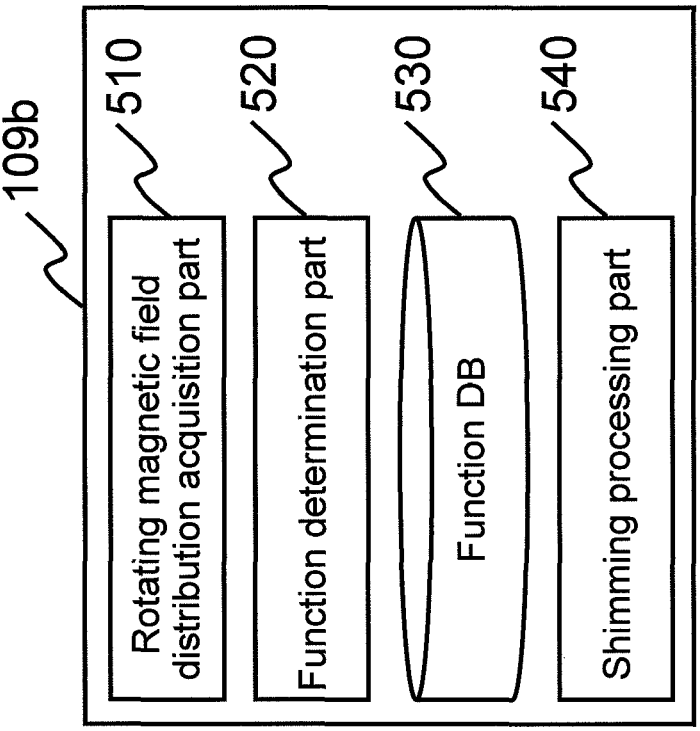
FIG. 20B is a functional block diagram of a computer according to the fourth embodiment.
Figure 20A:
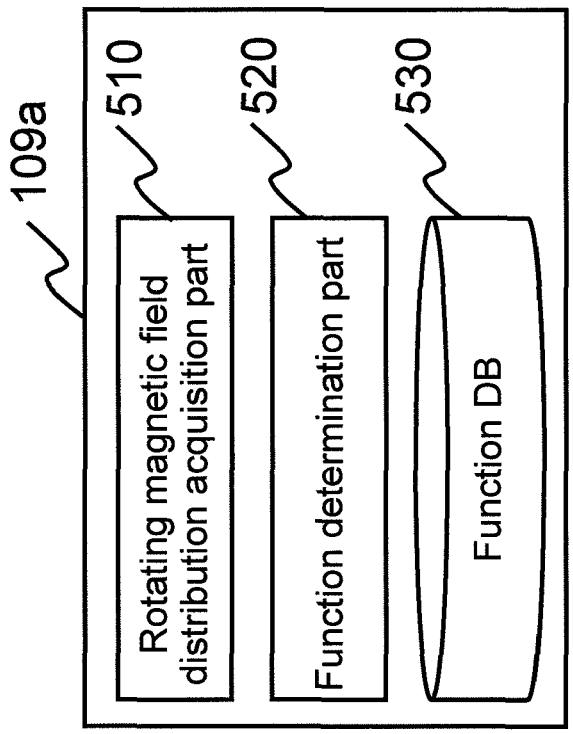
FIG. 20A is a functional block diagram of a computer according to the fourth embodiment.

A functional block diagram of the configuration relevant to this embodiment of a computer 109a in the MRI apparatus 100 according to this embodiment is shown in FIG. 20A. As shown in this drawing, in order to realize the aforementioned function, the computer 109a in the MRI apparatus 100 according to this embodiment is provided with a rotating magnetic field distribution acquisition part 510 for obtaining data of distribution of the rotating magnetic field $B_1$ generated by the RF transmission coil 114, and a function determination part 520 for determining which function is realized by each of a plurality of the trifunctional conductor loops 320 constituting the RF reception coil 115 on the basis of the obtained data of distribution of the rotating magnetic field $B_1$. The sequencer 104 makes the electrical connection control device 160 output a control signal so that a function determined by the function determination part 520 is realized.

The rotating magnetic field distribution acquisition part 510 performs imaging of the subject 103 for obtaining distribution of rotating magnetic field (magnetic field distribution acquisition imaging) defined beforehand to obtain distribution of the rotating magnetic field $B_1$. For the magnetic field distribution acquisition imaging, for example, such an imaging technique as the double angle method is used. According to an imaging sequence for this imaging stored beforehand, the sequencer 104 sends directions to the parts, and the obtained magnetic resonance signals are reconstructed to obtain distribution of the rotating magnetic field $B_1$.

The function determination part 520 extracts a rotating magnetic field $B_1$ in a region near the body surface of the subject 103 and in a region corresponding to position of each trifunctional conductor loop 320 for the trifunctional conductor loops 320 constituting the RF reception coil 115, from the obtained distribution of the rotating magnetic field $B_1$, and when it has an intensity not lower than a certain level, the corresponding trifunctional conductor loop 320 is determined to realize the magnetic field control function at the time of irradiation of a radio frequency magnetic field. The trifunctional conductor loop 320 corresponding to a region of intensity lower than the certain level is determined to realize the magnetic decoupling function at the time of irradiation of a radio frequency magnetic field.

The determination results are stored as a function database (function DB) 530 with matching them with the corresponding trifunctional conductor loops 320.

These operations are realized with CPU by loading a program stored in a storage device or storage medium 111 of the computer 109a beforehand into a memory and executing it. The function DB 530 is stored in the storage device or storage medium 111 of the computer 109a.

As explained for the first embodiment, the trifunctional conductor loop 320 makes magnetic flux density lower at the time of irradiation of a radio frequency magnetic field when it is controlled to realize the magnetic field control function, and therefore it can improve homogeneity of the rotating magnetic field $B_1$.

The sequencer 104 makes the electrical connection control device 160 transmit a control signal to each of the trifunctional conductor loops 320 with reference to the function DB 530 at the time of irradiation of a radio frequency magnetic field. That is, for the trifunctional conductor loop 320 for which such information that it realizes the magnetic field control function is stored in the function DB 530, it transmits a control signal to the second switch circuits, and thereby turns on the diodes 144 and 146 constituting the second switch circuits at the time of irradiation of a radio frequency magnetic field. Further, for the trifunctional conductor loop 320 for which such information that it realizes the magnetic decoupling function is stored, it transmits a control signal to the first switch circuit, and thereby turns on the diode 143 constituting the first switch circuit at the time of irradiation of a radio frequency magnetic field.

Figure 21A:
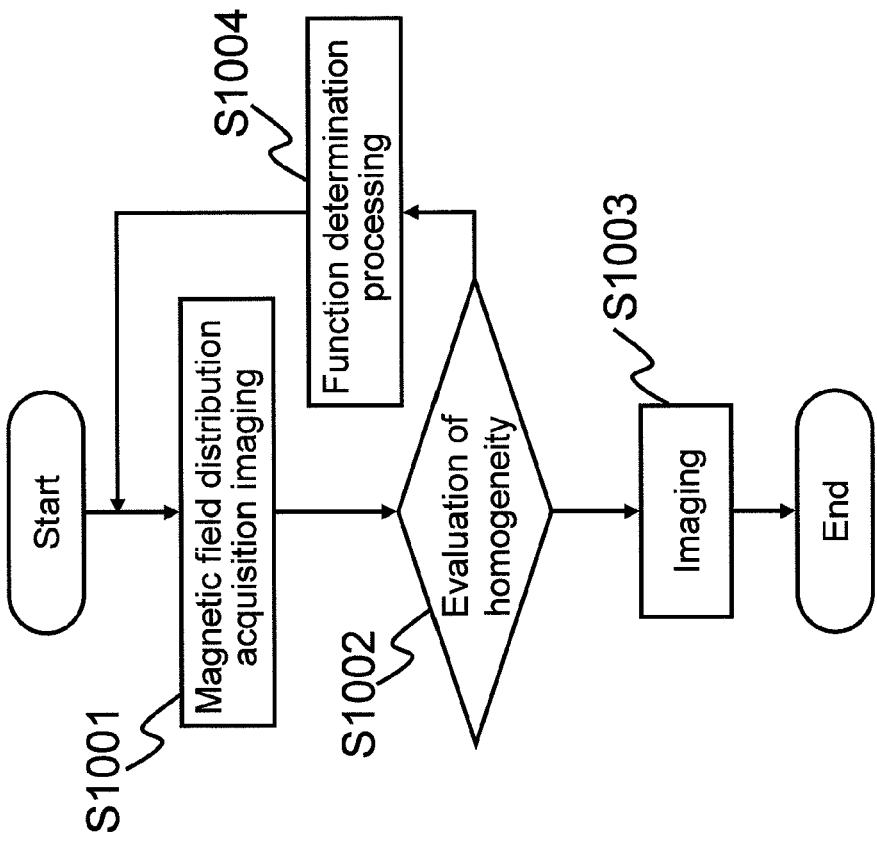
FIG. 21A is a flowchart of imaging processing according to the fourth embodiment.

Next, the flow of imaging processing of the whole imaging according to this embodiment will be explained. FIG. 21A shows the process flow of the imaging processing according to this embodiment. The imaging processing is started with a direction from a user or the like. Further, it is supposed that such information that all the trifunctional conductor loops 320 shall realize the magnetic decoupling function at the time of irradiation of a radio frequency magnetic field is stored in the function DB 530 as an initial setting.

If a direction for the start is received from a user, the rotating magnetic field distribution acquisition part 510 performs magnetic field distribution acquisition imaging according to an imaging sequence defined beforehand to obtain distribution of the rotating magnetic field $B_1$ (Step S1001). At the time of the magnetic field distribution acquisition imaging, each of the trifunctional conductor loops 320 is controlled to function according to the information stored in the function DB 530.

Then, the function determination part 520 evaluates homogeneity of the obtained distribution of the rotating magnetic field $B_1$ (Step S1002). This evaluation is performed by using, for example, the above-mentioned homogeneity index USD.

When USD is not larger than a certain value, and the distribution is determined to be sufficiently homogeneous as a result of the evaluation, the computer 109a performs the imaging without changing the function DB 530 (Step S1003), and ends the processing. At the time of the imaging, the sequencer 104 sends directions to the electrical connection control device 160 with reference to the function DB 530. The electrical connection control device 160 outputs control signals to the trifunctional conductor loops 320 according to the directions from the sequencer 104.

On the other hand, when homogeneity is determined to be insufficient in Step S1002, the function determination part 520 performs a function determination processing to determine the function of each of the trifunctional conductor loops 320 at the time of irradiation of a radio frequency magnetic field, and updates the function DB (Step S1004). Then, the processing moves to Step S1003.

Figure 22:
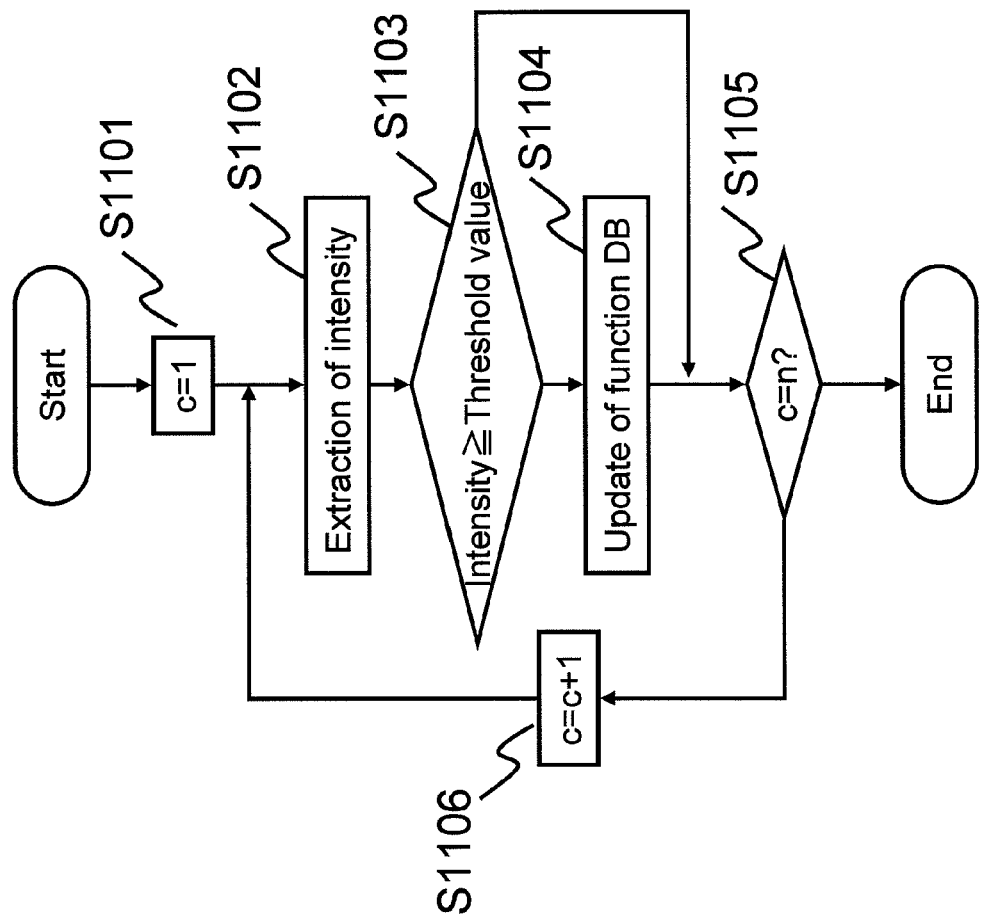
FIG. 22 is a flowchart of a function determination processing according to the fourth embodiment.

The details of the function determination processing in Step S1004 mentioned above are explained below. FIG. 22 shows the process flow of the function determination processing performed by the function determination part 520 according to this embodiment. In this explanation, it is supposed that there are n (n is a natural number) of the trifunctional conductor loops 320. Identification numbers are sequentially given to them from 1 in the ascending order, and the trifunctional conductor loop 320 given with the identification number m is called the m-th trifunctional conductor loop 320.

First, the function determination part 520 sets 1 in a counter c (Step S1101), and extracts intensity of the rotating magnetic field $B_1$ in a region in which the c-th trifunctional conductor loop 320 is disposed (Step S1102) for that trifunctional conductor loop 320. Then, the extracted intensity is compared with a threshold value defined beforehand (Step S1103). If the intensity is not lower than the threshold value, the c-th trifunctional conductor loop 320 is determined to realize the magnetic field control function at the time of irradiation of a radio frequency magnetic field, and the function DB is updated (Step S1104).

It is determined whether the processing is finished for all the trifunctional conductor loops 320, and if it is finished, the processing is ended (Step S1105). On the contrary, if it has not finished, the counter c is incremented by one (Step S1106), and the processing moves to Step S1102.

When the intensity is determined to be smaller than the threshold value in Step S1103, the function determination part 520 determines that the c-th trifunctional conductor loop 320 realizes the magnetic decoupling function at the time of irradiation of a radio frequency magnetic field, and the processing moves to Step S1105 without changing the function DB.

As explained above, according to this embodiment, by controlling the trifunctional conductor loops 320 constituting the RF reception coil 115, inhomogeneity of distribution of the rotating magnetic field $B_1$ at the time of irradiation of a radio frequency magnetic field can be corrected.

Therefore, according to this embodiment, images of high quality can be obtained at a low cost without any restriction on the pulse sequence and without any special burden to patients and technicians, as in the first and second embodiments.

Further, according to this embodiment, the trifunctional conductor loop 320 used in order to correct inhomogeneity of the magnetic field distribution is determined depending on the distribution of the rotating magnetic field $B_1$ and the disposition of the trifunctional conductor loop 320. Therefore, optimal control can be realized depending on the distribution of the rotating magnetic field $B_1$ varying according to the shape and physical properties of the subject 103, and depending on the configuration of the RF reception coil 115. Therefore, images of higher quality can be obtained with a simple configuration.

In the explanation of the embodiment mentioned above, the imaging sequence is actually executed for the subject 103, and distribution of the rotating magnetic field $B_1$ is obtained from the obtained magnetic resonance signals. However, the method for obtaining the distribution of the rotating magnetic field $B_1$ is not limited to such a method. For example, distributions of the rotating magnetic field $B_1$ obtained in the past may be stored as a database, and one obtained with conditions nearest to the intended imaging conditions may be chosen from them and used to determine the function of the trifunctional conductor loop 320.

Furthermore, distribution of the rotating magnetic field $B_1$ calculated by numerical simulation may also be used.

Further, in the above explanation of this embodiment, the function determination part 520 determines the function of the trifunctional conductor loop 320 from distribution of the rotating magnetic field $B_1$ by using the threshold value. However, the method for determining the function is not limited to such a method. An operator may determine the function of the trifunctional conductor loop 320 on the basis of the obtained distribution of the rotating magnetic field $B_1$.

By using such a configuration that an operator determines the function, the function of each conductor loop can be more appropriately determined, and images of higher quality can be obtained.

Figure 21B:
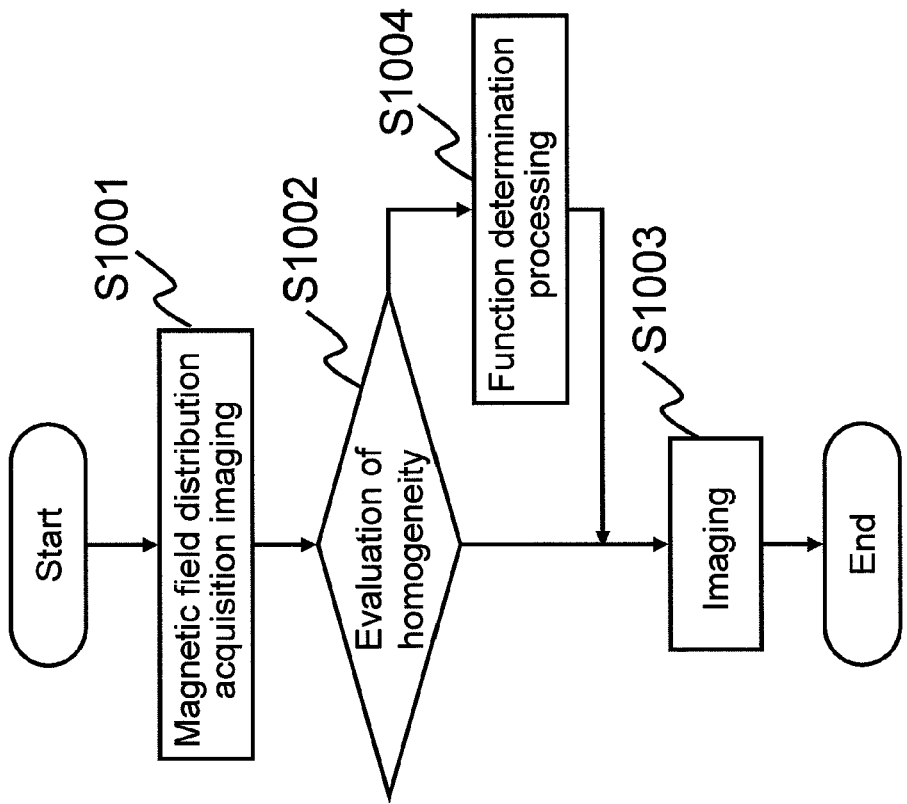
FIG. 21B is a flowchart of imaging processing according to the fourth embodiment.

Further, after the determination of the function of each conductor loop through the aforementioned function determination processing, optimization may be further performed by performing reevaluation and adjustment of the determination. The flow of the processing in such a case is shown in FIG. 21B.

The computer 109a performs the processings of Steps S1001 to S1004, as in the case shown in FIG. 21A. However, after the function of the trifunctional conductor loop 320 is determined in Step S1004, and the function DB 530 is updated, the processing returns to Step S1001 to obtain distribution of the rotating magnetic field $B_1$ again.

Furthermore, the "RF shimming" technique may be used in combination in this embodiment. The RF shimming is a technique for reducing inhomogeneity of the rotating magnetic field $B_1$ by controlling phase and amplitude of an RF pulse applied to the RF transmission coil 114. In such a case, a plurality of radio frequency magnetic field generators 106 and a multichannel RF transmission coil 114 are used. The multichannel RF transmission coil 114 is realized by providing a plurality of feeding points, and transmitting a plurality of RF signals of different phases and/or amplitudes generated by a plurality of the radio frequency magnetic field generators 106 to each of the feeding points. For example, it may consist of one birdcage coil 119 provided with two feeding points 124 as shown in FIG. 3A, or it may be a coil consisting of a plurality of loops each having a feeding point.

In the aforementioned case, the computer 109b is further provided with a shimming processing part 540, as shown in FIG. 20B. The shimming processing part 540 acquires distribution of the rotating magnetic field $B_1$, and performs an amplitude and phase determination processing in which amplitude and phase of RF wave applied to each channel of the RF transmission coil 114 so that inhomogeneity of the distribution of the rotating magnetic field $B_1$ is reduced. The flow of the processing in the case of using the "RF shimming" technique in combination is shown in FIG. 23. The functions of the computer 109b are realized with CPU by loading a program stored in a storage device of the computer 109b beforehand into a memory and executing it. The function DB 530 is stored in the storage device of the computer 109b.

The computer 109b performs the processings of Step S1001 to 1004, as in the case shown in FIG. 21A. After the function of each trifunctional conductor loop 320 is determined in Step S1004, and the function DB 530 is updated, the shimming processing part 540 performs the amplitude and phase determination processing for the distribution of the rotating magnetic field $B_1$ of which inhomogeneity has been reduced by the trifunctional conductor loops 320 (Step S1005), and the processing moves to Step S1003.

With such a configuration as described above, inhomogeneity in distribution of the rotating magnetic field $B_1$ can be further reduced.

In addition, the method of "RF shimming" combined with this embodiment is not limited to that described above. The method may be changed so that, for example, the amplitude and phase determination processing performed by the shimming processing part 540 and the determination of the function of each trifunctional conductor loop 320 are simultaneously performed, or the amplitude and phase determination processing is performed previously with the shimming processing part 540, and the function of each trifunctional conductor loop 320 is determined as required.

According to the aforementioned embodiments, stable imaging not suffering from unevenness of images is enabled with a lower cost for apparatus compared with conventional techniques, with reducing inhomogeneity of the rotating magnetic field intensity in magnetic resonance imaging apparatuses and with less burden on patients. Therefore, the RF reception coils of the aforementioned embodiments are applicable to various fields of imaging including medical uses.

DESCRIPTION OF NUMERICAL NOTATIONS

100: MRI Apparatus, 100a: MRI apparatus, 101: static magnetic field magnet, 102: gradient magnetic field coil, 103: subject, 104: sequencer, 105: gradient magnetic field power supply, 106: radio frequency magnetic field generator, 107: table, 108: receiver, 109: computer, 109a: computer, 109b: computer, 110: display, 111: storage medium, 112: shim coil, 113: shim power supply, 114: RF transmission coil, 115: RF reception coil, 115a: RF reception coil, 116: conductor loop, 117: phantom, 118: conductor plate, 119: birdcage coil, 120: magnetic flux, 124: feeding point, 140: capacitor, 140a: capacitor, 140b: capacitor, 140c: capacitor, 141: inductor, 142: capacitor, 143: diode, 144: diode, 145: preamplifier, 146: diode, 147: magnetic decoupling circuit, 148: cross diode pair, 149: cross diode pair, 151: electric current value at point 1, 152: electric current value at point 2, 153: electric current value at point 3, 160: electrical connection control device, 161: conductor wire for electrical connection control, 162: switch circuit, 210: conductor loop, 211: resonance circuit, 240: capacitor, 241: inductor, 242: capacitor, 243: diode, 245: preamplifier, 247: magnetic decoupling circuit, 310: conductor loop, 320: trifunctional conductor loop, 321: resonance circuit, 330: trifunctional conductor loop, 331: resonance circuit, 340: trifunctional conductor loop, 341: resonance circuit, 350: first bifunctional conductor loop, 360:

second bifunctional conductor loop, 360a: second bifunctional conductor loop, 361: resonance circuit, 361a: resonance circuit, 390: trifunctional conductor loop, 400: circuit, 401: inductor, 402: power supply part, 402: power supply part, 403: resistance, 404: resistance, 406: resistance, 510: rotating magnetic field distribution acquisition part, 520: function determination part, 530: function dB, 540: shimming processing part, 601: electric current, 602: electric current.

The invention claimed is:

1. An RF reception coil for receiving a magnetic resonance signal generated from a subject in response to receiving a radio frequency signal transmitted by an RF transmission coil in a magnetic resonance imaging apparatus, wherein:
   the RF reception coil is disposed in a bore formed by the RF transmission coil,
   the RF reception coil comprises a plurality of conductor loops,
   at least one of the conductor loops comprises:
   at least one capacitor and
   a switch circuit that is connected to the capacitor in parallel, and controls electrical connection, and
   when the switch circuit is driven, the switch circuit makes the conductor loop having the switch circuit function as a magnetic field adjustment circuit that shields or enhances a magnetic field generated by the RF transmission coil.

2. The RF reception coil according to claim 1, wherein:
   the conductor loop having the switch circuit is disposed so as to reduce inhomogeneity in distribution of the magnetic field generated by the RF transmission coil.

3. The RF reception coil according to claim 1, wherein:
   each of the plurality of the conductor loops has a respective said switch circuit, and
   the switch circuit of at least one conductor loop defined beforehand is driven at the time of irradiation of the radio frequency signal so that inhomogeneity in distribution of the magnetic field generated by the RF transmission coil is reduced.

4. The RF reception coil according to claim 3, wherein:
   each conductor loop further comprises a magnetic decoupling circuit,
   the magnetic decoupling circuit is connected to the one capacitor of the conductor loop in parallel, and
   the magnetic decoupling circuit of a conductor loop of which the switch circuit is not driven at the time of transmission of the radio frequency signal is driven.

5. The RF reception coil according to claim 1, wherein:
   a respective said switch circuit is connected in parallel to each of the capacitors provided in the conductor loop.

6. The RF reception coil according to claim 1, wherein:
   the switch circuit comprises a diode.

7. The RF reception coil according to claim 1, wherein:
   the switch circuit comprises a micro-electro-mechanical system.

8. The RF reception coil according to claim 1, wherein:
   the switch circuit comprises a variable resistor.

9. The RF reception coil according to claim 4, wherein:
   the magnetic decoupling circuit is a circuit comprising a diode and an inductor connected in series.

10. A magnetic resonance imaging apparatus comprising a static magnetic field formation portion to form a static magnetic field, a gradient magnetic field application portion to apply a gradient magnetic field, a radio frequency signal transmission portion to transmit a radio frequency signal to a subject, a magnetic resonance signal reception portion to receive a magnetic resonance signal generated from the subject, and a control portion to control the gradient magnetic field application portion, the radio frequency signal transmission portion, and the magnetic resonance signal reception portion, wherein:
    the magnetic resonance signal reception portion includes the RF reception coil according to claim 1.

11. A magnetic resonance imaging apparatus comprising a static magnetic field formation portion to form a static magnetic field, a gradient magnetic field application portion to apply a gradient magnetic field, a radio frequency signal transmission portion to transmit a radio frequency signal to a subject, a magnetic resonance signal reception portion receive a magnetic resonance signal generated from the subject, and a control portion to control the gradient magnetic field application portion, the radio frequency signal transmission portion, and the magnetic resonance signal reception portion, wherein:
    the magnetic resonance signal reception portion includes the RF reception coil according to claim 4, and
    the control portion includes an electrical connection control portion that drives the switch circuit and the magnetic decoupling circuit at the time of transmission of the radio frequency signal.

12. The magnetic resonance imaging apparatus according to claim 11, wherein:
    the control portion further comprises a function determination portion that determines in which conductor loop the switch circuit is driven at the time of transmission of the radio frequency signal.

13. The magnetic resonance imaging apparatus according to claim 10, wherein:
    the radio frequency signal transmission portion transmit a plurality of radio frequency signals of which amplitude and phase are independently controlled to the subject, so that inhomogeneity in distribution of a magnetic field is reduced.

14. The magnetic resonance imaging apparatus according to claim 13, wherein:
    the control portion determines values of amplitude and phase of the plurality of the radio frequency signals at the time of transmission of the radio frequency signals.

* * * * *